(12) United States Patent
Mendenhall

(10) Patent No.: US 11,575,354 B2
(45) Date of Patent: Feb. 7, 2023

(54) CLASS D AMPLIFIER WITH CURRENT MODE CONTROL

(71) Applicant: RGB Systems, Inc., Anaheim, CA (US)

(72) Inventor: Eric Mendenhall, Trabuco Canyon, CA (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

(21) Appl. No.: 17/405,940

(22) Filed: Aug. 18, 2021

(65) Prior Publication Data

US 2022/0069783 A1 Mar. 3, 2022

Related U.S. Application Data

(60) Provisional application No. 63/217,180, filed on Jun. 30, 2021, provisional application No. 63/211,969, filed on Jun. 17, 2021, provisional application No. 63/070,178, filed on Aug. 25, 2020.

(51) Int. Cl.
*H03F 3/217* (2006.01)
*H03F 3/187* (2006.01)

(52) U.S. Cl.
CPC ........... *H03F 3/2171* (2013.01); *H03F 3/187* (2013.01); *H03F 2200/03* (2013.01); *H03F 2200/171* (2013.01); *H03F 2200/462* (2013.01)

(58) Field of Classification Search
CPC .... H03F 3/2171; H03F 3/187; H03F 2200/03; H03F 2200/171; H03F 2200/462; H03F 3/183
USPC ....................................... 330/10, 251, 207 A
See application file for complete search history.

(56) References Cited

U.S. PATENT DOCUMENTS

| 7,400,191 B2 * | 7/2008 | Rodriguez .......... H03F 3/45475 330/10 |
| 10,778,160 B2 * | 9/2020 | Butler ................... H03F 3/2173 |
| 2005/0017799 A1 | 1/2005 | Risbo et al. |
| 2022/0173706 A1 * | 6/2022 | Lin ........................ H03F 3/217 |

FOREIGN PATENT DOCUMENTS

KR 10-0972155 61 7/2010

OTHER PUBLICATIONS

Extended European Search Report in European Application No. 21192551.6, dated Jan. 25, 2022 in 7 pages.
Dr. Fred C. Lee, "User's Design Handbook for A Standardized Control Module (SCM) for DC to DC Converters, vol. 2, Final Report" (NASA CR- 165173), Apr. 1980, TRW Defense and Space Systems Group, in 161 pages.
Dr. Fred C. Lee et al., "Application Handbook for A Standardized Control Module (SCM) for DC to DC Converters, vol. 1, Final Report" (NASA CR- 165172), Apr. 1980, TRW Defense and Space Systems Group, in 242 pages.

* cited by examiner

*Primary Examiner* — Hieu P Nguyen
(74) *Attorney, Agent, or Firm* — Knobbe, Martens, Olson & Bear, LLP

(57) ABSTRACT

An audio amplifier that implements current mode control without the use of an explicit or separate current mode sensor is disclosed. The audio amplifier may include a pair of feedback loops that provide current from a node located before an inductor of an output filter and current from a node located after the inductor of the output filter to an integrator circuit. The integrator circuit may be formed from existing circuitry of the audio amplifier controller. Thus, current mode control can be implemented without a separate current mode sensor.

21 Claims, 18 Drawing Sheets

CLASS D AMPLIFIER WITH CURRENT MODE CONTROL

INCORPORATION BY REFERENCE TO ANY PRIORITY APPLICATIONS

This application claims priority to the following provisional applications, each of which is hereby expressly incorporated by reference herein in its entirety for all purposes: U.S. Provisional Application No. 63/070,178, which was filed on Aug. 25, 2020 and is titled "CLASS D AMPLIFIER WITH CURRENT MODE CONTROL"; U.S. Provisional Application No. 63/211,969, which was filed on Jun. 17, 2021 and is titled "CLASS D AMPLIFIER WITH CURRENT MODE CONTROL"; and U.S. Provisional Application No. 63/217,180, which was filed on Jun. 30, 2021 and is titled "CLASS D AMPLIFIER WITH CURRENT MODE CONTROL." Any and all applications for which a foreign or domestic priority claim is identified in the Application Data Sheet as filed with the present application are hereby incorporated by reference under 37 CFR 1.57.

FIELD OF THE DISCLOSURE

The present disclosure relates to audio amplifier. More specifically, the present disclosure relates to a class D amplifier with current mode control.

BACKGROUND

Audio amplifiers are often used to amplify an audio signal before providing the audio amplifier to a speaker. One common type of amplifier used to implement an audio amplifier is a class D amplifier. A class D amplifier is a switching amplifier in which the transistors of the amplifier operate as electronic switches. Typically, the transistors switch back and forth between a pair of supply rails. Often, the class D amplifier is controlled using a voltage mode controller.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to an audio amplifier. The audio amplifier can include: a power output stage configured to output an audio output signal, the audio output signal generated by amplifying an audio input signal; an output filter connected to the power output stage and configured to filter the audio output signal to generate a filtered output signal, wherein the output filter comprises an inductor; a first feedback loop between a first node and a summing node, the first node between the power output stage and the inductor, wherein the first feedback loop is configured to provide a first current to an integrator at the summing node; and a second feedback loop between a second node and the summing node, the second node between the inductor and an output of the audio amplifier, wherein the second feedback loop is configured to provide a second current to the integrator at the summing node, and wherein an integrator output of the integrator provides current mode control of the audio amplifier.

The audio amplifier of the preceding paragraph can include any combination or sub-combination of the following features: where the filtered output signal is output by the audio amplifier for supply to a speaker; where the power output stage comprises a first field-effect transistor connected between the output filter and a first rail voltage, and a second field effect transistor connected between the output filter and a second rail voltage; where the first feedback loop comprises a first resistor configured to provide the first current to the integrator; where the second feedback loop comprises a second resistor connected between the second node and a third resistor that is connected between the second resistor and a fourth resistor; where a resistance of the fourth resistor is equal to a resistance of the first resistor multiplied by a ratio of a resistance of the third resistor to a resistance of the second resistor; where the second feedback loop further comprises a first operational amplifier, and wherein the third resistor is connected between an inverting input of the first operational application and an output of the first operational amplifier; where the first operational amplifier is configured as an inverter; where the second feedback loop comprises a second integrator configured to provide the second current to the summing node; where the integrator comprises a differential integrator, and wherein the second feedback loop comprises an RC circuit coupled to a positive input of an operational amplifier of the differential integrator; where a combination of the first current and the second current generates a current that is proportional to a winding voltage of the inductor; wherein the audio amplifier further includes the integrator, wherein the integrator comprises a capacitor and a second operational amplifier, and wherein the capacitor is connected between an inverting input of the second operational amplifier and an output of the second operational amplifier; where the output filter comprises a low-pass filter implemented using an RLC circuit; where the integrator is implemented using elements of a type 2 controller of the audio amplifier; where the integrator output of the integrator provides current mode control of the audio amplifier without the inclusion of a current sensor; and where the audio amplifier further comprises a square wave clock input to the summing node, and a comparator configured to receive the integrator output at a positive input of the comparator, and wherein a negative input of the comparator is connected to ground thereby enabling elimination of a triangle generator of the audio amplifier.

Additional aspects of the present disclosure relate to an audio system. The audio system can include a speaker configured to output audio and an audio amplifier in communication with the speaker and configured to provide audio to the speaker for output. The audio amplifier may include: a power output stage configured to output an audio output signal to the speaker to produce the audio output, the audio output signal generated by amplifying an audio input signal; an output filter connected to the power output stage and configured to filter the audio output signal to generate a filtered output signal, wherein the output filter comprises an inductor; a first feedback loop between a first node and a summing node, the first node between the power output stage and the inductor, wherein the first feedback loop is configured to provide a first current to an integrator at the summing node; and a second feedback loop between a second node and the summing node, the second node between the inductor and an output of the audio amplifier, wherein the second feedback loop is configured to provide a second current to the integrator at the summing node, and wherein an integrator output of the integrator provides current mode control of the audio amplifier.

The audio system of the preceding paragraph can include any combination or sub-combination of the following features: where the first feedback loop comprises a first resistor configured to provide the first current to the integrator; where the second feedback loop comprises a second resistor connected between the second node and a third resistor that is connected between the second resistor and a fourth resistor; where a resistance of the fourth resistor is selected to equal a resistance of the first resistor multiplied by a ratio of a resistance of the third resistor to a resistance of the second resistor; where the second feedback loop further comprises a first operational amplifier, wherein the third resistor is connected between an inverting input of the first operational application and an output of the first operational amplifier, and wherein the first operational amplifier is configured as an inverter; where the audio system further includes the integrator, wherein the integrator comprises a capacitor and a second operational amplifier, and wherein the capacitor is connected between an inverting input of the second operational amplifier and an output of the second operational amplifier; and where a combination of the first current and the second current generates a current that is proportional to a winding voltage of the inductor

BRIEF DESCRIPTION OF THE DRAWINGS

Throughout the drawings, reference numbers are re-used to indicate correspondence between referenced elements. The drawings are provided to illustrate certain aspects of the subject matter described herein and not to limit the scope thereof.

DETAILED DESCRIPTION

Introduction

Certain types of amplifiers (e.g., audio amplifiers) may be used to amplify an audio signal. An amplified audio signal output by the audio amplifier may be provided as input to a speaker, which may output audio. There are different types of amplifiers that may be used as an audio amplifier. One example of an amplifier that may be used as an audio amplifier is a class D amplifier. A class D amplifier can include transistors used to switch between different rail voltages and is typically not a linear gain device. The switches of the class D amplifier may be switched rapidly between the supply rails +Vrail and −Vrail. Advantageously, in certain implementations, the class D amplifier can be more efficient than a linear amplifier. The class D amplifier may be implemented using field-effect transistors (FETs), such as metal-oxide-semiconductor field-effect transistors (MOSFETs).

Generally, the control system of the class D amplifier operates in a voltage mode. In the voltage mode, a voltage may be applied to a second order LC filter. The filter resonance is damped by the load resistance, which can lead to a great deal of peaking under unloaded or lightly loaded conditions. A class D amplifier typically includes a low-pass output filter that filters frequencies above a particular frequency threshold (e.g., frequencies above an audible frequency level). The voltage control mode allows the filter resonance to shape the frequency response of the output filter.

Figure 1A:
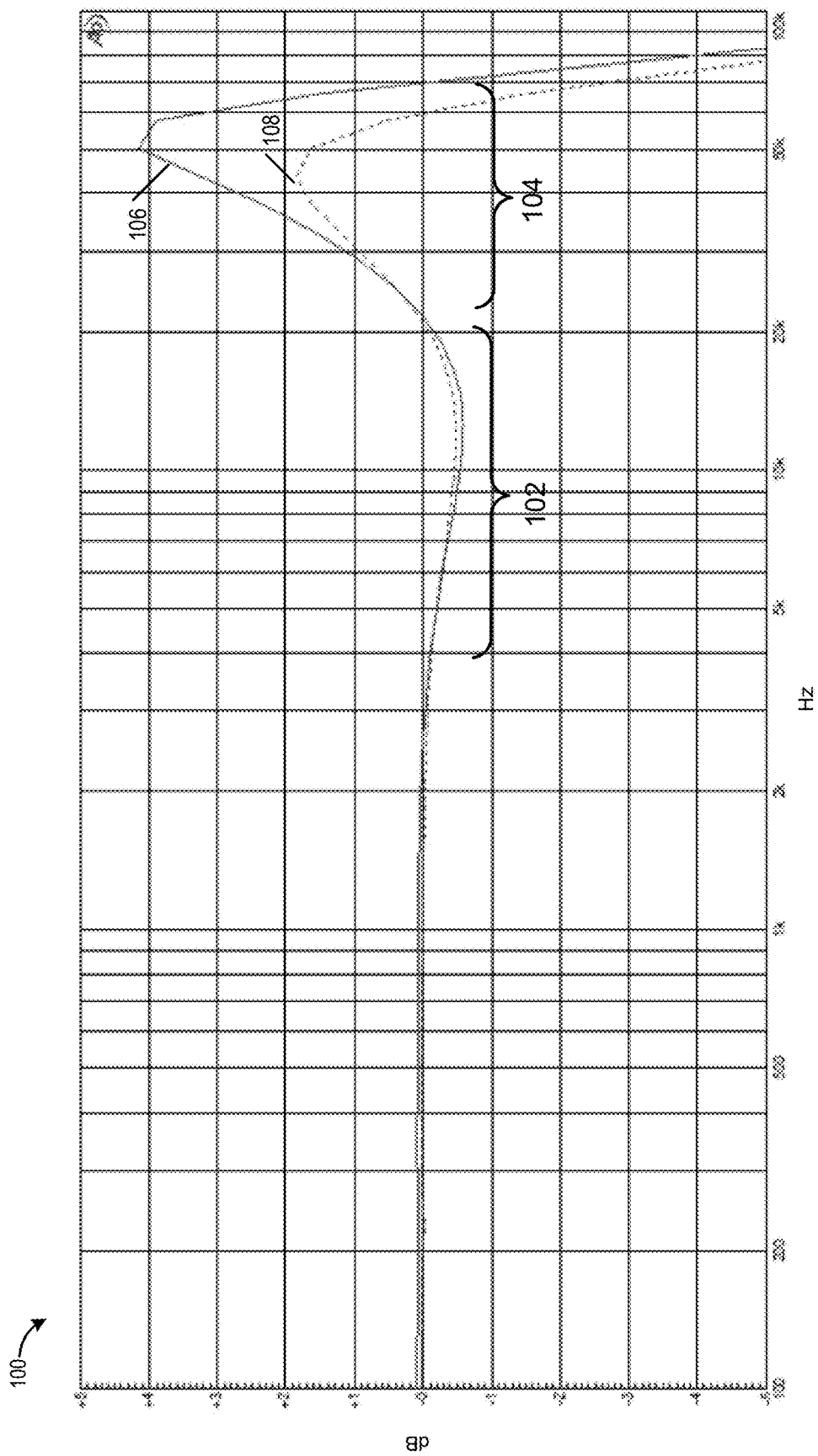
FIG. 1A illustrates a graph of a frequency response of a class D amplifier implemented using voltage mode control.

FIG. 1A illustrates a graph 100 of a frequency response of a class D amplifier implemented using voltage mode control. The right side of the graph 100 illustrates how the resonance shapes the response of the output filter. From the graph 100, it can be seen that as the frequency of the output signal increases, the frequency response first dips or droops in the region 102 of the graph 100, and then peaks and begins to drop back down towards 0 dB in the region 104 of the graph 100.

The graph 100 illustrates two lines associated with different load conditions caused by the load on the audio amplifier by a speaker connected to the audio amplifier. The line 106 represents the frequency response of the class D amplifier without a load (e.g., when the audio amplifier is not connected to a speaker). The line 108 represents the frequency response of the amplifier when connected to a speaker with an 8Ω impedance. It should be understood that different speakers may apply different load impedances to the audio amplifier resulting in different frequency responses. However, each of these frequency responses may include a droop in the region 102 and a peak in the region 104.

The region 102 with the droops is typically undesirable as it indicates a dip in the transfer function between the input and output signal. This dip in the transfer function can affect the accuracy of the reproduction of the audio (e.g., of music being output by a speaker connected to the amplifier). Ideally, it is desirable to have a flat frequency response so that the audio reproduction is accurate at all audible frequencies. In other words, it is usually desirable to have the same gain at high frequencies as is achieved at low frequencies.

The region 104 includes peaks that may exceed the pass band of the output filter of the amplifier. Further, the peaks may exceed the audio region. Thus, at least some of the peak may have a limited effect, or no effect, on the audio sound. However, the peaks can cause the output of the amplifier to exceed a threshold that can cause damage to a speaker.

One solution to keep the peaks reasonable, or from exceeding a threshold, is to add a damping network to prevent the gain at high frequencies from exceeding a threshold. Without the damping network, the gain may increase to dangerous levels at certain frequencies. For example, signal voltage may get high enough at certain frequencies (e.g., ultrasonic frequencies) to damage the speaker. For instance, assume a system is designed to output up to 100 volts. If the peak reached 6 dB, then the output may rise to 200 volts, which would exceed the component ratings and the design of the amplifier. The inclusion of the damping network can limit the peaks, but may add cost and introduce filter losses.

Another solution is to use high frequency switching for the class D amplifier. FIG. 1A illustrates the use of high frequency switching to reduce peaks at certain higher output frequencies (e.g., at 50 kHz). Even with high frequency switching, as illustrated by the line 106, the peak may exceed 4 dB and, in some cases, the peak can reach up to 6 dB at higher frequencies. Accordingly, in the illustrated example, the output filter would need to accommodate up to twice the output voltage (e.g., 200 volts AC instead of 100 volts AC) to prevent damage to the speaker connected to the amplifier. The use of high-frequency switching, like the addition of a damping circuit, can also result in loss in the signal output. Further, as illustrated in FIG. 1A, the use of high-frequency switching does not prevent the droops or dips, or fully prevent peaking.

Another solution is to use current mode control instead of voltage mode control. The use of current mode control can eliminate filter resonance, such as the filter resonance illustrated in FIG. 1A, that can lead to the dips and peaks in the frequency response. The use of current mode control, in which a current loop is closed around the inductor current and feeds the output capacitor, can remove the peaking and allow a frequency response that more closely approximates a linear amplifier. To implement current mode control, it is necessary to sense the output current, or the current through the output filter. To sense the current, a current sensor may be inserted into the audio amplifier. There are several types of current sensors. For example, the current sensor can be a resistive sensor, a magnetic sensor, or a Hall effect sensor. However, each of these current sensors come with their own trade-offs or drawbacks.

Figure 1B:
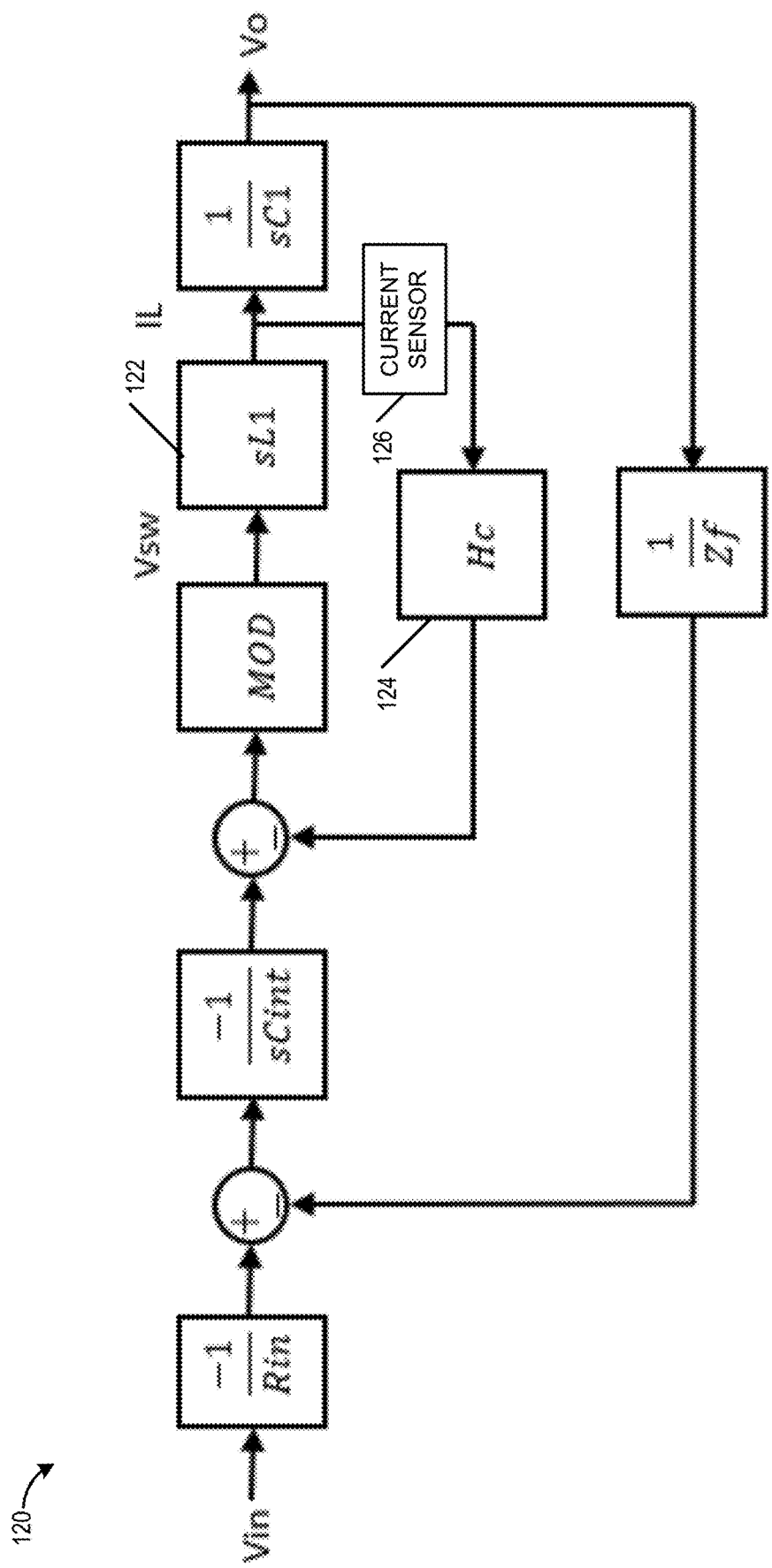
FIG. 1B illustrates a block diagram of a class D amplifier using current mode control.

FIG. 1B illustrates a block diagram of an example class D amplifier 120 using a current sensor to implement current mode control. The inductor current of the inductor 122 may be sensed directly, scaled and converted to a voltage by a transfer function represented by Hc 124. A current sensor 126 may be positioned between the inductor 122 and Hc 124 and may supply a sensed current to the transfer function Hc 124, which may then be fed back and subtracted from the current programming signal to form a current loop. The class D amplifier 120 may further include an outer voltage loop formed using a Type II system comprised of an impedance 1/Zf and an integrator 1/Cint. There are many ways to sense the inductor current. For example, the current sensor 126 may be a resistive current sensor or a current sense transformer.

Implementing a resistive current sensor may include adding a resistor in series with the output filter of the audio amplifier. The resistor is generally relatively small and provides a correspondingly very small signal that serves as the current sense signal. However, this small signal may be masked by or difficult to detect when compared to the relatively large voltage of the output filter. For example, the output voltage may reach 100 volts AC, while the current sense signal may be as small as 100 millivolts riding on top of the 100 voltage output signal. It can be difficult to detect the 100 millivolt current sense signal due, for example, to common mode errors associated with differential elements (e.g., an operational amplifier (op amp)) included in the amplifier. To sense the relatively small voltage (e.g., order of millivolts) of the current sense resistor riding on top of the relatively large voltage (e.g., order of volts) of the output filter, the voltage of the resistive current sensor must be translated down to ground level to be useable by the control circuit of the audio amplifier. However, translating the voltage level of the current sense resistor is impractical with commercially available resistors. To successfully adjust the voltage level, it would be necessary to trim the common mode voltage errors using, for example, a potentiometer. This is an impractical solution for an audio amplifier. Further, the resistive current sensor introduces some FR loss into the amplifier. The smaller the signal, the worse the common mode errors become. Thus, the use of the current sense resistor to implement current mode control defeats the purpose of trying to eliminate the loss introduced using voltage mode control with the high frequency switching.

An alternative to using the current sense resistor is to use a magnetic sensor, or a current sense transformer. However, the current sense transformer is relatively large, expensive, and difficult to manufacture. As another alternative, a Hall effect sensor can be used to sense current. However, a Hall effect sensor may introduce a lot of noise into the audio amplifier system. Further, the performance of the audio amplifier using a Hall effect sensor to implement current mode control is limited making it difficult if not impossible to obtain professional level performance for high-end applications.

Aspects of the present disclosure relate to an audio amplifier that implements current mode control without the use of an explicit or separate current mode sensor. The audio amplifier may include a pair of feedback loops that provide current from a node located before an inductor of an output filter and current from a node located after the inductor of the output filter to an integrator circuit. The integrator circuit may be formed from existing circuitry of the audio amplifier controller. Thus, current mode control can be implemented without a separate current mode sensor. Further, embodiments disclosed herein may simplify the amplifier by repurposing and repositioning integrators to reduce the number of integrators and to reduce the number of operational amplifiers used by the amplifier without increasing noise or total harmonic distortion in the audio amplifier.

Example Audio Amplifier System

Figure 2A:
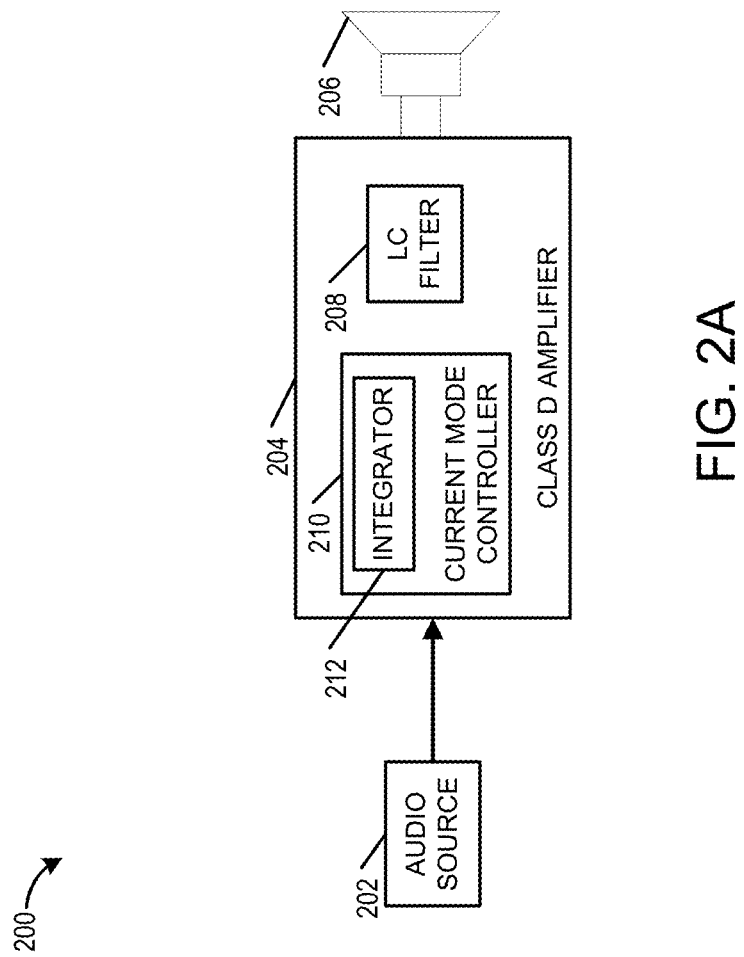
FIG. 2A illustrates a block diagram of an audio amplifier system in accordance with certain embodiments.

FIG. 2A illustrates a block diagram of a sound system or an audio amplifier system 200 in accordance with certain embodiments. The audio amplifier system 200 may include an audio source 202 configured to supply an audio input signal to an amplifier, such as the audio amplifier 204. The audio source 202 may include any type of system that can generate an audio signal, or a pre-amp audio signal to be supplied to an audio amplifier. For example, the audio source 202 may be a television, a radio, a computing system, a disc player (e.g., Blu-ray player), or the like.

The audio source 202 may generate an audio signal. This audio signal may, in some cases, be directly provided to a speaker for output. However, in other cases, the audio signal is supplied to an amplifier, such as the audio amplifier 204. The audio amplifier 204 is a class D amplifier, and may include any type of Class D amplifier that can amplify an audio input signal before providing the amplified audio input signal to a speaker (or multiple speakers), such as the speaker 206. In some cases, the audio output signal of the audio amplifier 204 may be supplied to multiple speakers. In other cases, different audio output signals may be supplied to different speakers, such as in a stereo system or a surround sound system that can output different audio signals associated with one performance. The speaker 206 may be a single speaker or a set of multiple speakers. Further, the speaker 206 may represent a speaker system configured to output audio associated with different parts of a performance.

The audio amplifier 204 may include an output filter 208, such as an LC filter formed by one or more inductors and one or more capacitors. The output filter 208 may include any type of filter that can filter frequencies outside of the audio spectrum from an output signal of the audio amplifier 204. In some cases, the output filter 208 is a low pass filter configured to filter out or exclude frequencies within the output signal that exceed a particular frequency.

The audio amplifier 204 further includes a current mode controller 210. The current mode controller 210 may be any type of controller that can control the operation of the audio amplifier 204 based on a current of the audio amplifier 204 that is feedback from the output filter 208 to the current mode controller 210. Further, the current mode controller 210 may include an integrator 212 that is configured to integrate the feedback current. The current mode controller may be a type II controller. Additional details relating to the audio amplifier 204 and the current mode controller 210 are described herein.

Example Audio Amplifier Circuit

Figure 2B:
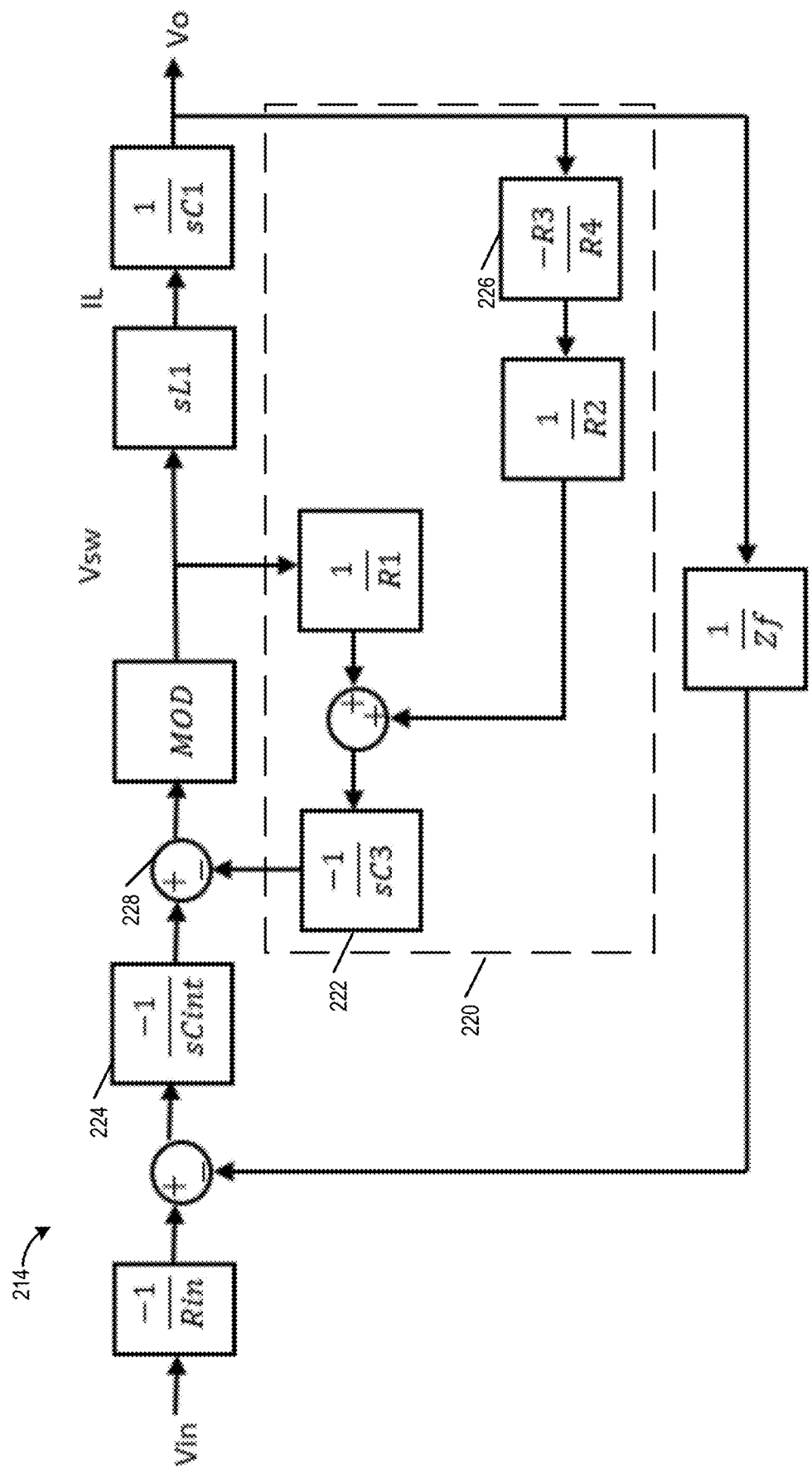
FIG. 2B illustrates a block diagram of a current controlled audio amplifier without an explicit current sensor in accordance with certain embodiments.

FIG. 2B illustrates a block diagram 214 of a current controlled audio amplifier 204 without an explicit current sensor in accordance with certain embodiments. The current sensor 126 of the amplifier 120 may be replaced by an opamp circuit 220 that may sense the current of the audio amplifier 204. The opamp circuit 220 may be or may be part of the current mode controller 210. The opamp circuit 220 may include an integrator 222 represented by −1/sC3, which may be summed with another integrator 224 represented by −1/sCint of the audio amplifier 204. The integrators may be summed by the adder circuit 228. Further, the opamp circuit 220 may include a pair of opamps with one being represented by the integrator 222 and one being represented by block 226 corresponding to −R3/R4.

Figure 2C:
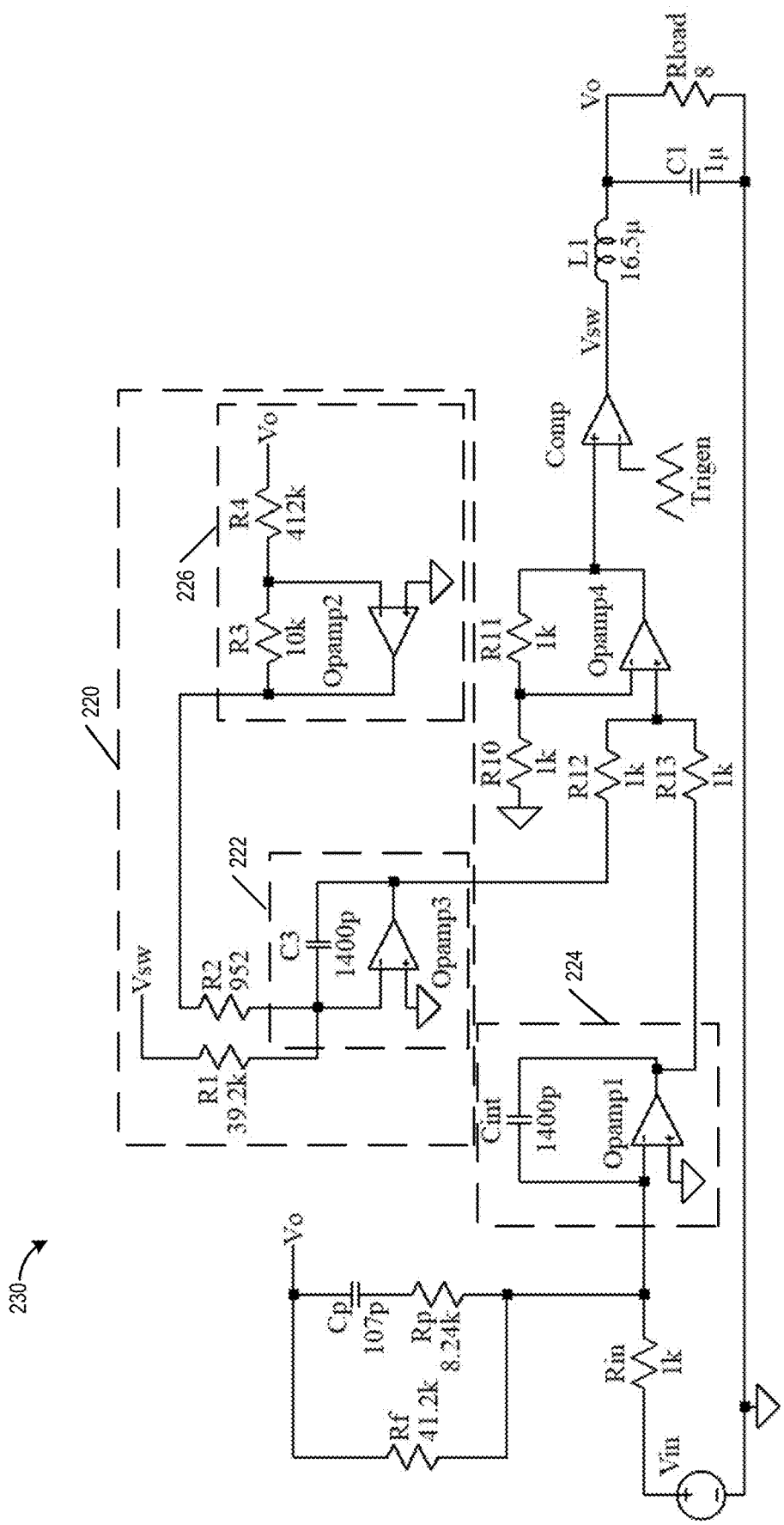
FIG. 2C illustrates an example circuit implementation corresponding to the block diagram of FIG. 2B in accordance with certain embodiments.

FIG. 2C illustrates an example circuit 230 that corresponds to the block diagram of FIG. 2B. As illustrated in FIG. 2C, the opamp circuit 220 may be implemented using a pair of opamps, Opamp2 and Opamp3, with associated components R1, R2, R3, R4 and C3. Opamp2 may be included in the −R3/R4 block 226. Opamp3 along with C3 may function as the integrator 222.

The integrator 222 receives currents as inputs. Thus, to sense the current of the inductor L1, we need a total current input proportional to the voltage across the inductor L1. This voltage in the circuit 230 may be given by (Vsw−Vo). A first current, Vsw/R1, may be supplied to the integrator 222 directly through the resistor R1. For the second term a current equal to −Vo/R1 is needed. To get the negative sign an inverting opamp (Opamp2) may be used. If the gain of the Opamp2 were −1, R2 could be set equal to R1. However, since the output amplitude is usually much higher than the opamp supports, R3/R4 may be selected as the inverse of the power amplifier overall gain, scaling Vo back down to Vin. Scaling the voltage down means the resistor R2 must also be scaled down such that:

$$R2 = R1 * \frac{R3}{R4}$$

For the case where C3=Cint, the opamp circuit 220 can be simplified to remove an integrator. In FIGS. 2B and 2C, the output of two integrators are being subtracted. In other words, the output of the integrator 222 is being subtracted from the output of integrator 224. Since the integral of a sum is the sum of the integrals, it is possible to eliminate an integrator by modifying the location of the integrator relative to the summing or adder circuit.

Figure 2D:
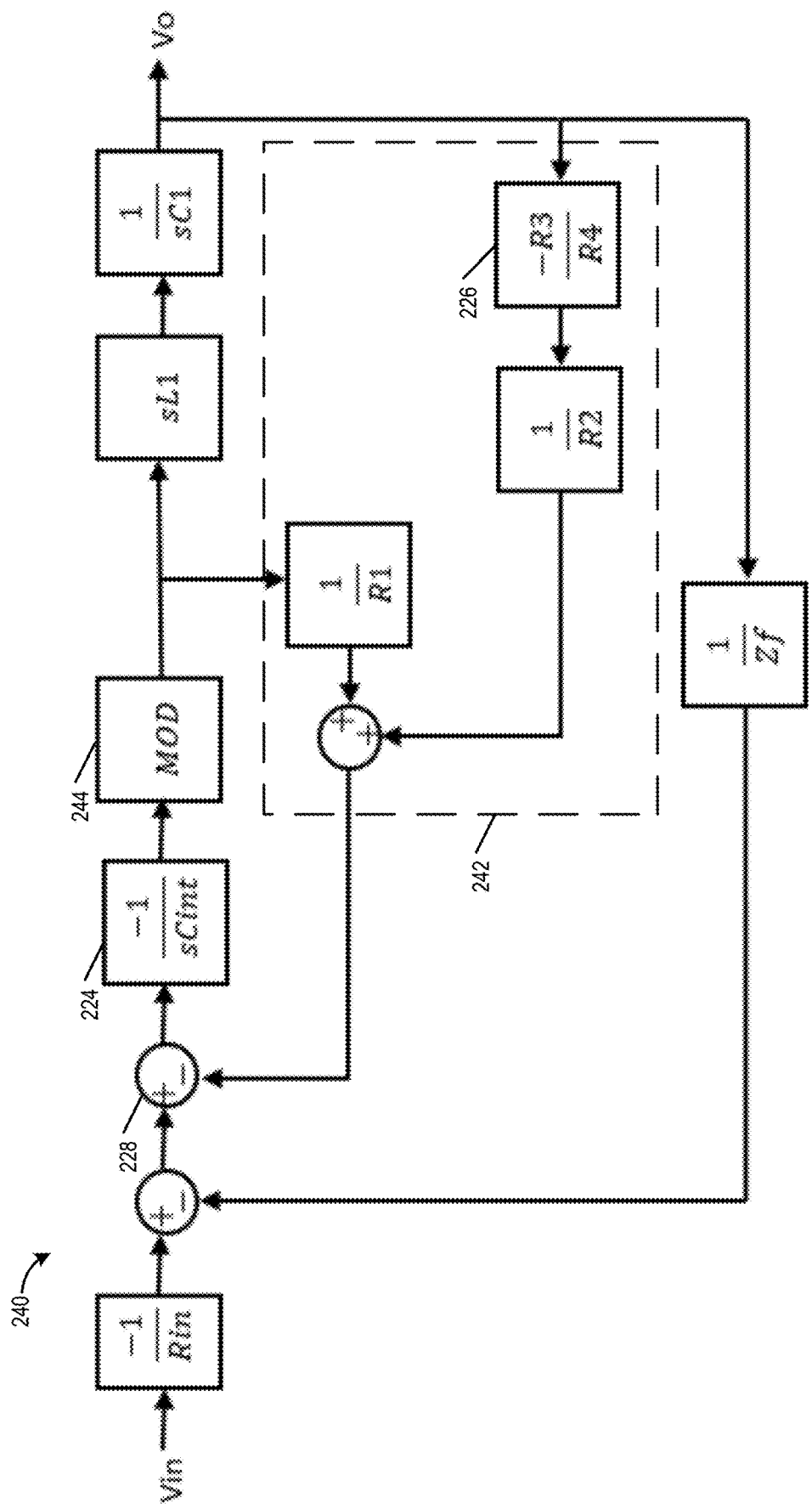
FIG. 2D illustrates a block diagram of a simplified current controlled audio amplifier without an explicit current sensor and with a reduced opamp circuit in accordance with certain embodiments.

FIG. 2D illustrates a block diagram 240 of a simplified current controlled audio amplifier without an explicit current sensor and with a reduced opamp circuit in accordance with certain embodiments. Comparing the block diagram 240 to the block diagram 214 of FIG. 2B, it can be determined that the integrator 224 is moved from before the adder circuit 228 to after the adder circuit 228, and, in the case where C3=Cint, the integrator 222 may be eliminated. The adder circuit 228 may comprise any type of circuit that can add two signals. In some cases, the adder circuit 228 may be a node within the circuit that serves to sum two received signals. This node may also be referred to as a summing node.

Figure 2E:
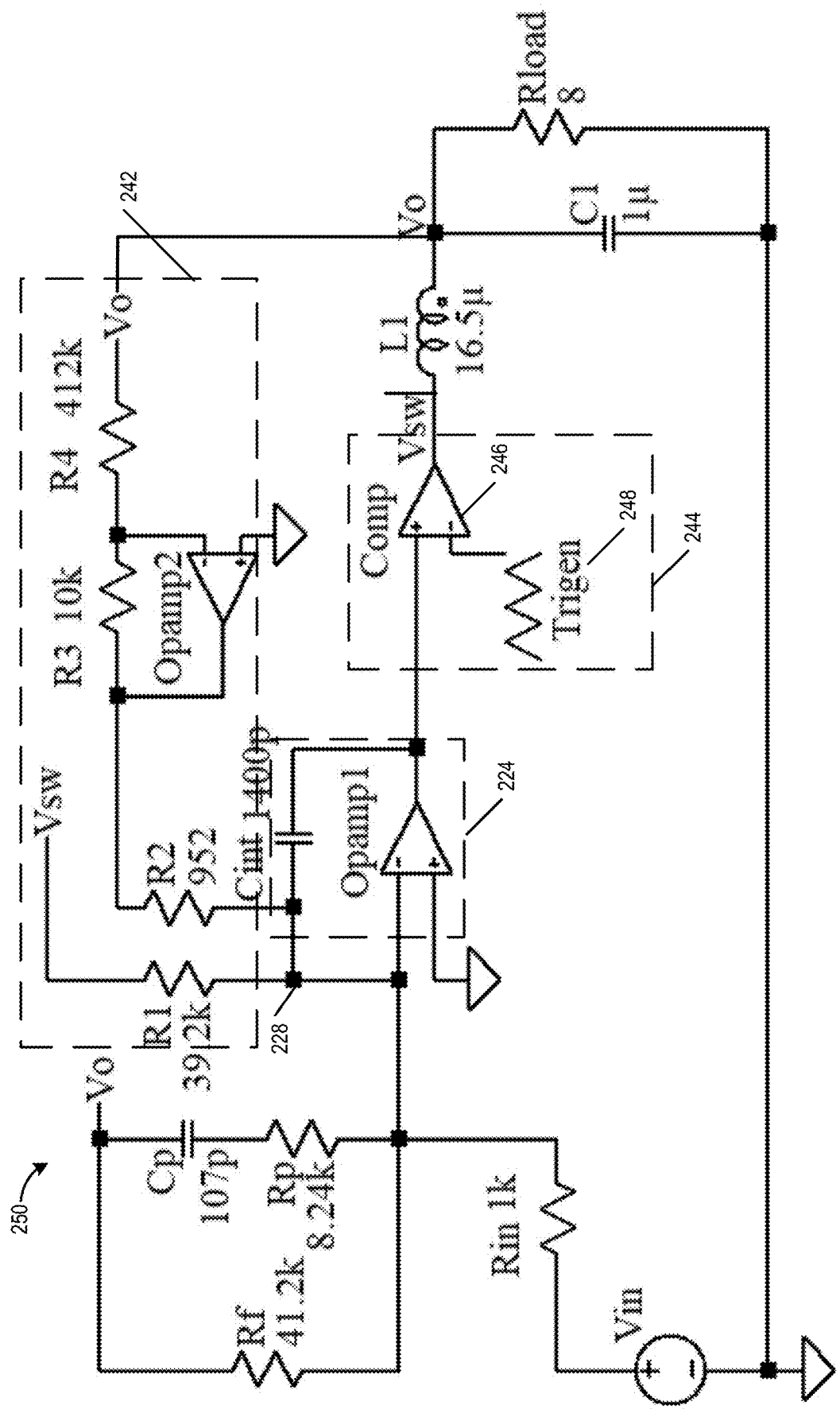
FIG. 2E illustrates an example circuit implementation corresponding to the block diagram of FIG. 2D in accordance with certain embodiments.

Further, as illustrated by the audio amplifier circuit 250 of FIG. 2E, the removal of the integrator enables the reduction of opamps from two in the opamp circuit 220 to one in the opamp circuit 242. Moreover, as illustrated in FIG. 2E, because the extra integrator has been eliminated, it is possible to remove a second opamp corresponding to Opamp4 in FIG. 2C previously used to sum the integrators 222 and 224. Consequently, the number of opamps in the audio amplifier may be reduced from 4 opamps in the circuit 230 to 2 opamps in the circuit 250. Advantageously, the reduction in opamps results in reduced circuit complexity and cost compared to prior designs.

To simplify the figures, and not to limit the disclosure herein, a number of feedback loops included in the circuits described herein are not fully illustrated within the figures. These loops are instead indicated in the drawings by duplicating labels to indicate that a circuit path exists between two points. For example, in FIG. 2E, the labels Vsw after the comparator 246 and the label Vsw before the resistor R1 indicates that a circuit path exists connecting the two points labelled Vsw. Thus, the switching voltage Vsw is fed back from the comparator 246 to the input of the integrator 224 via the loop between the comparator 246 and the resistor R1. Similarly, the output voltage Vo is feedback to the RC circuit formed from the resistor Rp and the capacitor Cp as labelled in FIG. 2E. Other feedback loops exist in the various circuits illustrated herein as identified by different nodes within the circuits that share common labels.

Second Example Audio Amplifier Circuit

Figure 3:
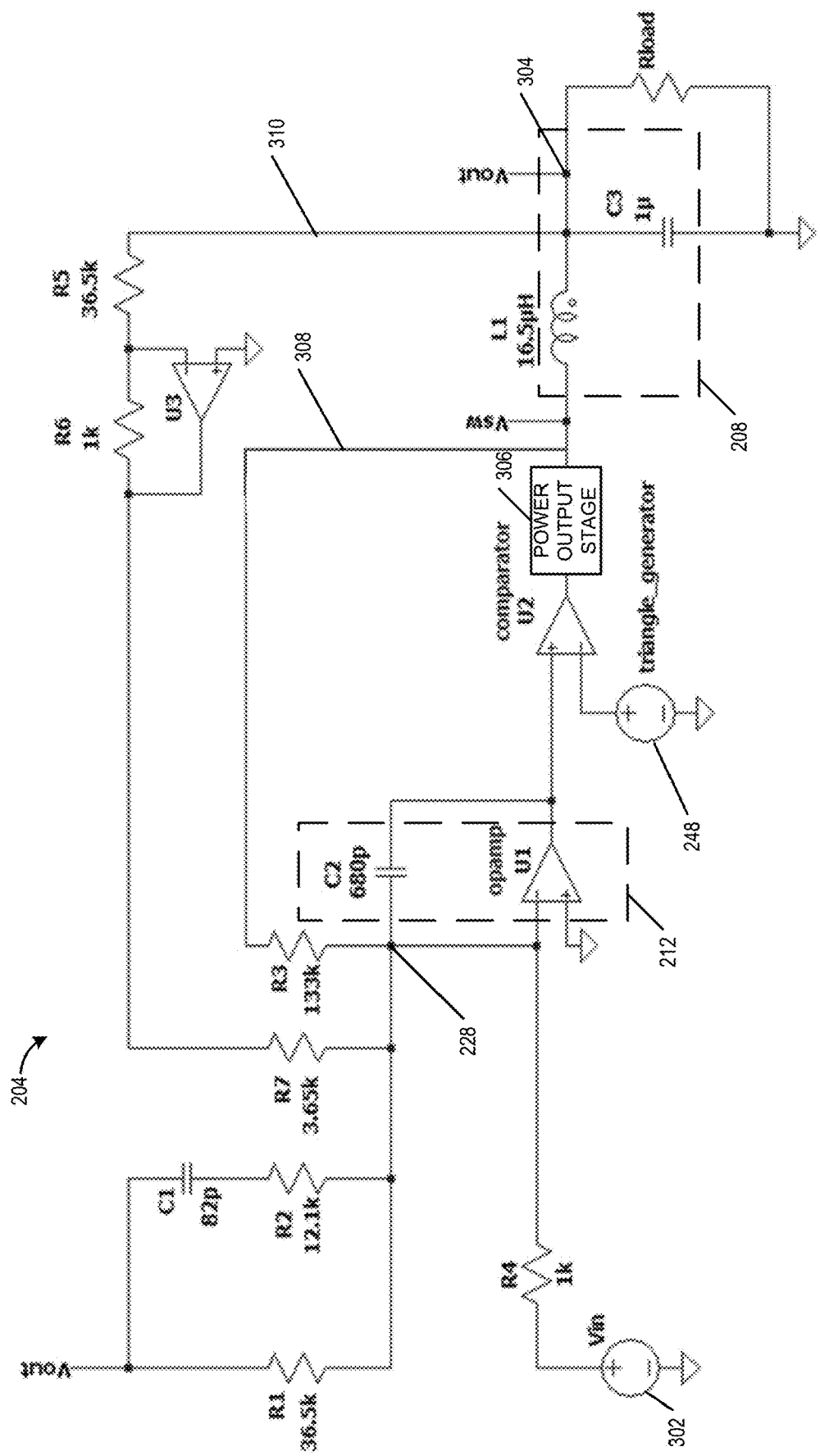
FIG. 3 illustrates a circuit diagram of an audio amplifier in accordance with certain embodiments.

FIG. 3 illustrates a circuit diagram of an audio amplifier 204 in accordance with certain embodiments. The circuit of FIG. 3 is similar to the circuit of FIG. 2E, but illustrates the use of different circuit values. It should be understood that different resistance, capacitor, and inductance values may be used in the audio amplifier 204 based on the desired specifications for the audio amplifier 204. Moreover, the embodiments described above with respect to FIGS. 2A-2E are applicable to FIG. 3 and vice versa.

The audio amplifier 204 may receive an input audio signal, represented by $V_{in}$ 302, and generate an amplified version of the audio signal that is output to a speaker at $V_{out}$ 304. The speaker may be represented by the load $R_{load}$. The output signal $V_{out}$ may be processed or filtered by an output filter 208. The output filter 208 may be an LC filter implemented by the inductor L1 and the capacitor C3. In some cases, the output filter 208 may be an RLC circuit. Further, the output filter 208 may receive an output signal from the power output stage 306 and filter out the frequencies above a particular threshold while maintaining frequencies below the threshold. The frequency threshold may be selected to correspond to an upper limit of frequencies that can be heard by at least certain users or humans. In some cases, the threshold may be higher than the human audible spectrum. For example, the threshold may be set at 20 kHz, 30 KHz, 50 kHz, or higher or any range between the preceding.

Figure 6:
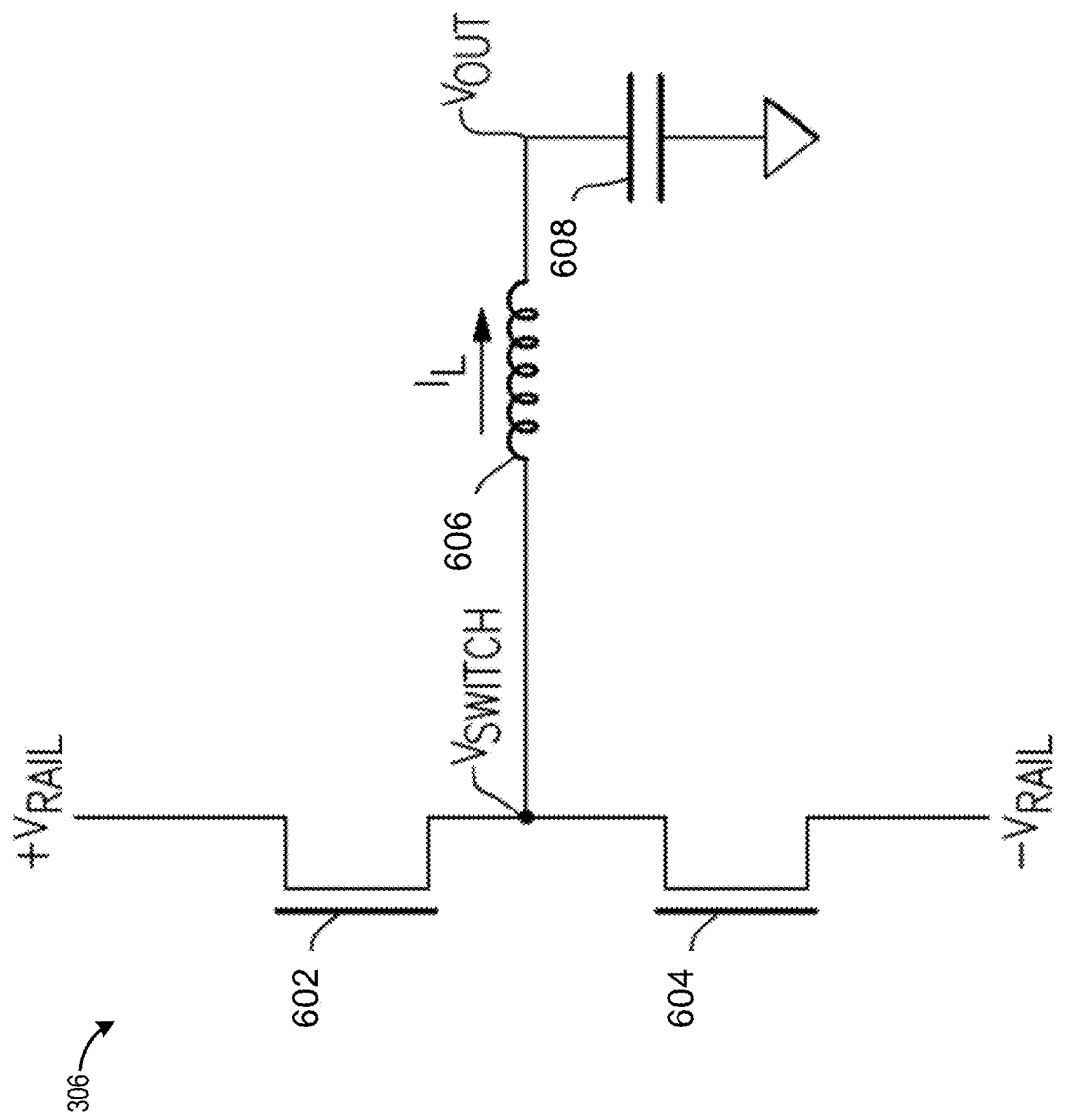
FIG. 6 illustrates a simplified circuit diagram of an output stage of an example class D amplifier in accordance with certain embodiments.

The power output stage 306 may be one stage of a multi-stage amplifier. The power output stage 306 may include a pair of transistors connected between two rail voltages. The power output stage 306 may switch between the two rail voltages. Often, but not necessarily, the two rail voltages are of the same magnitude, but opposite phase (e.g., +/−5 Volts). Additional details of an example power output stage 306 are illustrated in FIG. 6 below.

The audio amplifier 204 may include a type II controller that is formed by an op amp U1, resistors R1, R2, R4, and capacitors C1 and C2. The type II controller may control the switching frequency of the audio amplifier 204. Controlling the switching frequency of the audio amplifier 204 may include controlling the switching frequency of switching connecting transistors of the power output stage 306 between at least a first rail voltage and a second rail voltage.

To enable the current mode control, it is desirable to determine the current flowing through the inductor L1 of the output filter 208. The inductor current and voltage are related by the equation V=L di/dt, or I=1/L ∫Vdt. Thus, determining the integral of the voltage across the inductor L1 divided by the inductance L of the inductor L1 may provide the current through the inductor L1. The integration may be performed by an integrator 212 formed using the op amp U1 and the capacitor C2 of the controller of the audio amplifier 204. The op amp U1 and the capacitor C2 are included as part of the audio amplifier controller, which may be a type II (or type 2) controller. In the absence of the current mode control, U1 and C2 along with additional components may be used to a form a Type III control system. Thus, in the present disclosure, U1 and C2 may be repurposed to determine the current through the inductor L1 without the addition of a separate integrator. The integrator may be used for current mode control as part of the type II controller, and also may be used to reconstruct inductor current by integrating the inductor voltage. Thus, current mode control can be performed by supplying a current through the inductor L1 into the summing node 228 that is proportional to the winding voltage of the inductor L1. This current may be described as (Vsw−Vout)/R3, where Vsw represents the switching voltage before the inductor L1, and Vout represents the output voltage after the inductor L1.

The inductor current may be provided to the summing node 228 by dividing the current described by the equation (Vsw−Vout)/R3 into two parts. The first current, Vsw/R3 may be supplied by a first feedback loop 308. The first feedback loop 308 may include the resistor R3 that is configured to supply the current Vsw/R3 to the summing node 228. A second feedback loop 310 may be used to provide the current −Vout/R3 to the summing node 228. Thus, the inductor current is sensed or determined by sensing the voltage on each side of the inductor L1. As we can determine the voltage on each side of L1, we can integrate the voltage to determine the current. The second feedback loop 310 may be formed from the resistors R5, R6, and R7 connected in series, and an op amp U3. The resistor R6 may further be connected between the inverting input of the op amp U3 and the output of the op amp U3. The op amp U3 inverts the voltage value through the feedback lip 310 enabling the current Vout/R3 to be subtracted from the current Vsw/R3 to obtain the current through the inductor L1. As illustrated in FIG. 3, current may also flow through R1 and R2 into the summing node as part of the Type II controller functionality, but is not included in the inductor current reconstruction addressed by the above equations.

FIG. 3 illustrates example values for the resistors R3, R5, R6, and R7 used in the first feedback loop 308 and the second feedback loop 310. It should be understood that the illustrated values are examples and other resistors may be used. However, although other resistors are possible, the resistors may be subject to the constraint R7=R3*R6/R5. In other words, the resistance of R7 may be equal to the resistance of R3 multiplied by a ratio of the resistance of R6 to the resistance of R5.

The output of the integrator 212 may be supplied to a first input of the comparator U2, which can compare the integrator 212 output to a signal generated by the triangle generator and supplied to a second input of the comparator U2. The output of the comparator U2 may be supplied to the power output stage 306 of the audio amplifier 204 to control operation of the power output stage 306. Based on the control signal supplied to the power output stage 306, the transistors of the power output stage 306 may connect to or receive a voltage from one of at least a pair of rail voltages. The integrator output and the triangle wave from the triangle generator may be provided to the comparator U2. The comparator U2 output may drive the power output stage 306. Generally, the comparator U2 has a relatively small signal level (e.g., +2.5 V to −2.5 V). The power output stage 306 may convert the signal to a larger signal level (e.g., +100 V to −100 V, or +80 V to −80 V). Although not illustrated in all of the example circuits illustrated herein, it should be understood that a power output stage 306 may exist between the comparator and the output filter as illustrated in FIG. 3.

Advantageously, in certain embodiments, the loss is reduced or eliminated using the current mode control illustrated in FIG. 3. Further, by reusing the existing integrator 212 and adding a feedback loop 310, the circuit size and complexity is reduced compared to using a separate current sensor or voltage mode control.

Example Square Wave Audio Amplifier Circuit

Figure 4A:
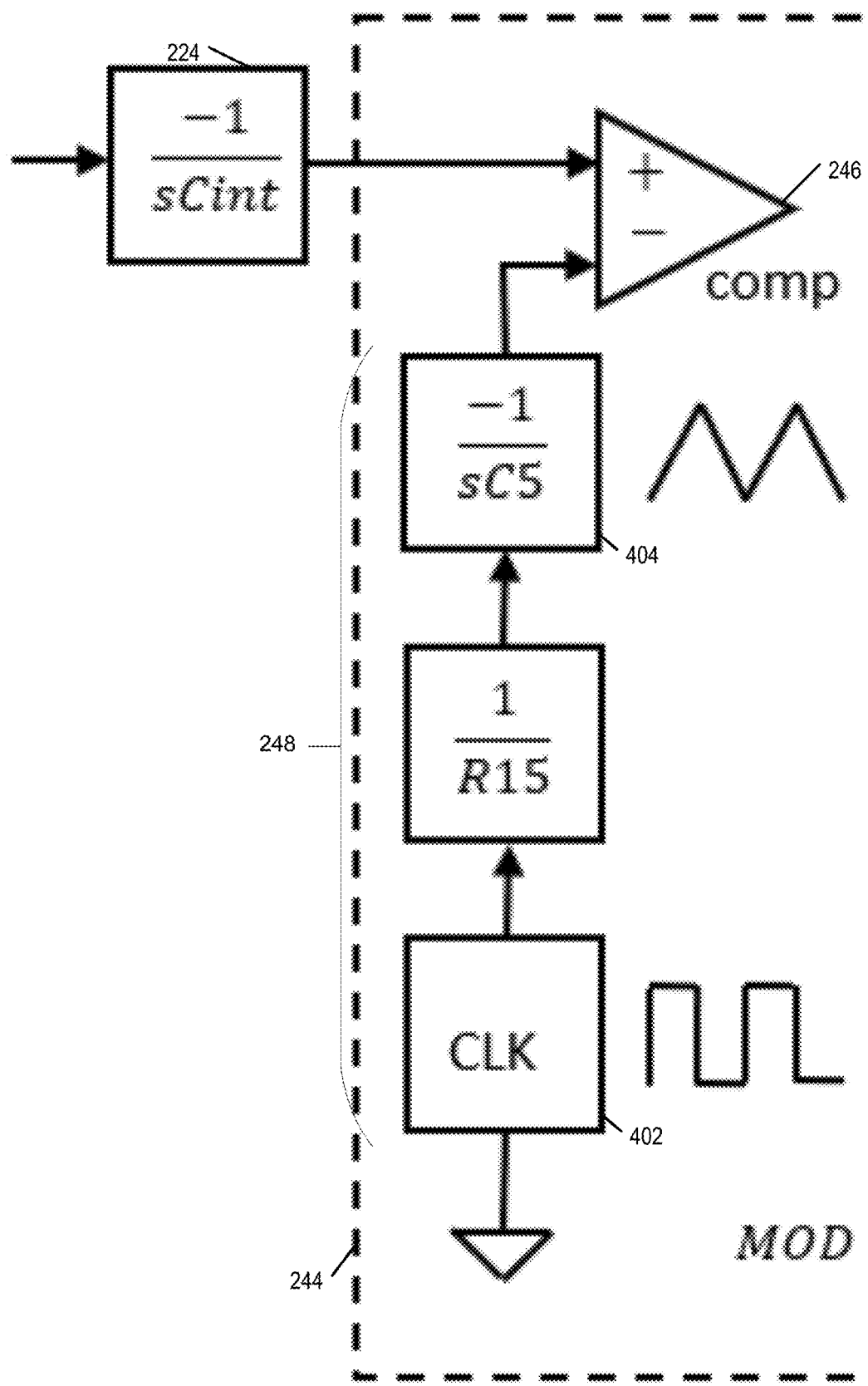
FIG. 4A illustrates a block diagram of an integrator and modulator of the current controlled audio amplifiers of FIGS. 2B and 2D in accordance with certain embodiments.

The audio amplifier circuits illustrated in FIGS. 2A-2E and FIG. 3 are implemented using a triangle generator (e.g., the triangle generator 248). To further simplify the audio amplifier, the triangle generator 248 may be combined with the integrator 224. Referring to FIG. 2D, the integrator 224 and the modulator 244 can be expanded as illustrated in FIG. 4A. The modulator 244 may include the comparator 246 and the triangle generator 248 illustrated in, for example, FIG. 2E.

Referring to FIG. 4A, the triangle signal generated by the triangle generator 248 may be generated from a square wave clock 402 using an integrator circuit 404. By making similar adjustments to the modulator 244 that were made to the opamp circuit 220, it is possible to eliminate the integrator circuit 404 further simplifying the audio amplifier 204.

Figure 4B:
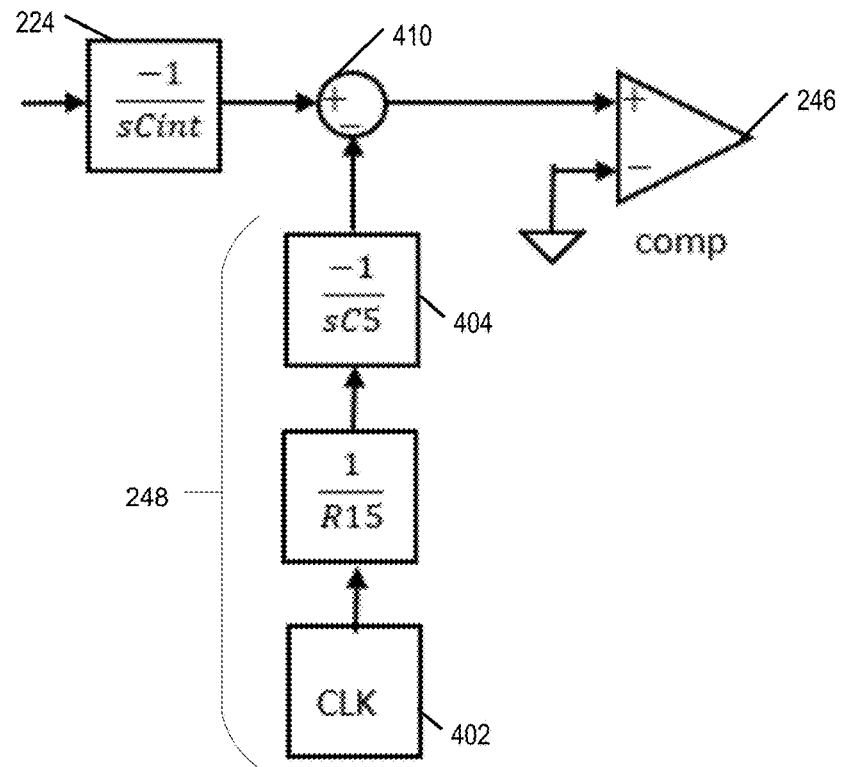
FIG. 4B illustrates a block diagram adjusting the location of the triangle generator of FIG. 4A in accordance with certain embodiments.

Referring to FIG. 4B, the first step in eliminating the integrator circuit 404 is to shift the triangle generator 248 from the inverting input of the comparator 246 to the noninverting input of the comparator 246 by adding the signal of the triangle generator 248 to the output of the integrator 224 using an adder or summer circuit 410. It is possible to move the triangle generator 248 from one input of the comparator 246 to the other input of the comparator 246 by subtracting the signal from each side. Subtracting the triangle generator 248 from the inverting input of the comparator 246 puts the inverting input to ground. The summer circuit 410 may then be used to subtract the triangle generator 248 from the integrator 224.

Figure 4C:
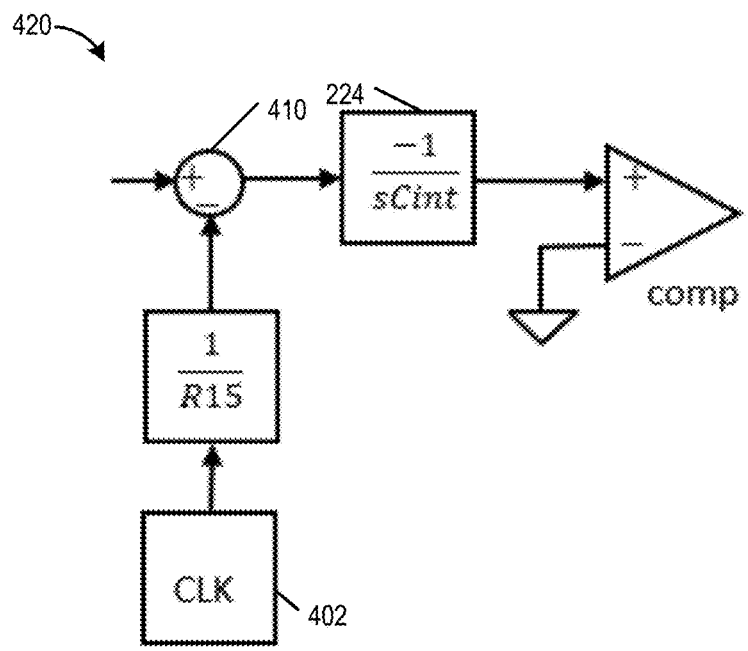
FIG. 4C illustrates a block diagram of a simplified modulator of FIGS. 4A and 4B in accordance with certain embodiments.

As previously explained, as the sum of integrals can be equated to the integral of the sum, it is possible to eliminate one of the integrators by repositioning it with respect to the summer circuit 410. Thus, as illustrated in FIG. 4C, moving the integrator 224 to the output of the summer circuit 410 enables elimination of the integrator 404 (or combining of the integrator 404 with the integrator 224) from the triangle generator 248. Moreover, replacing the combination of the integrator 224 and modulator 244 with the circuit 420 illustrated in FIG. 4C enables the audio amplifier 204 to operate directly from a square wave eliminating the need for using a triangle wave. The use of the square wave clock 402 in place of a triangle wave for the audio amplifier 204 is illustrated in FIGS. 4D and 4E.

Figure 4D:
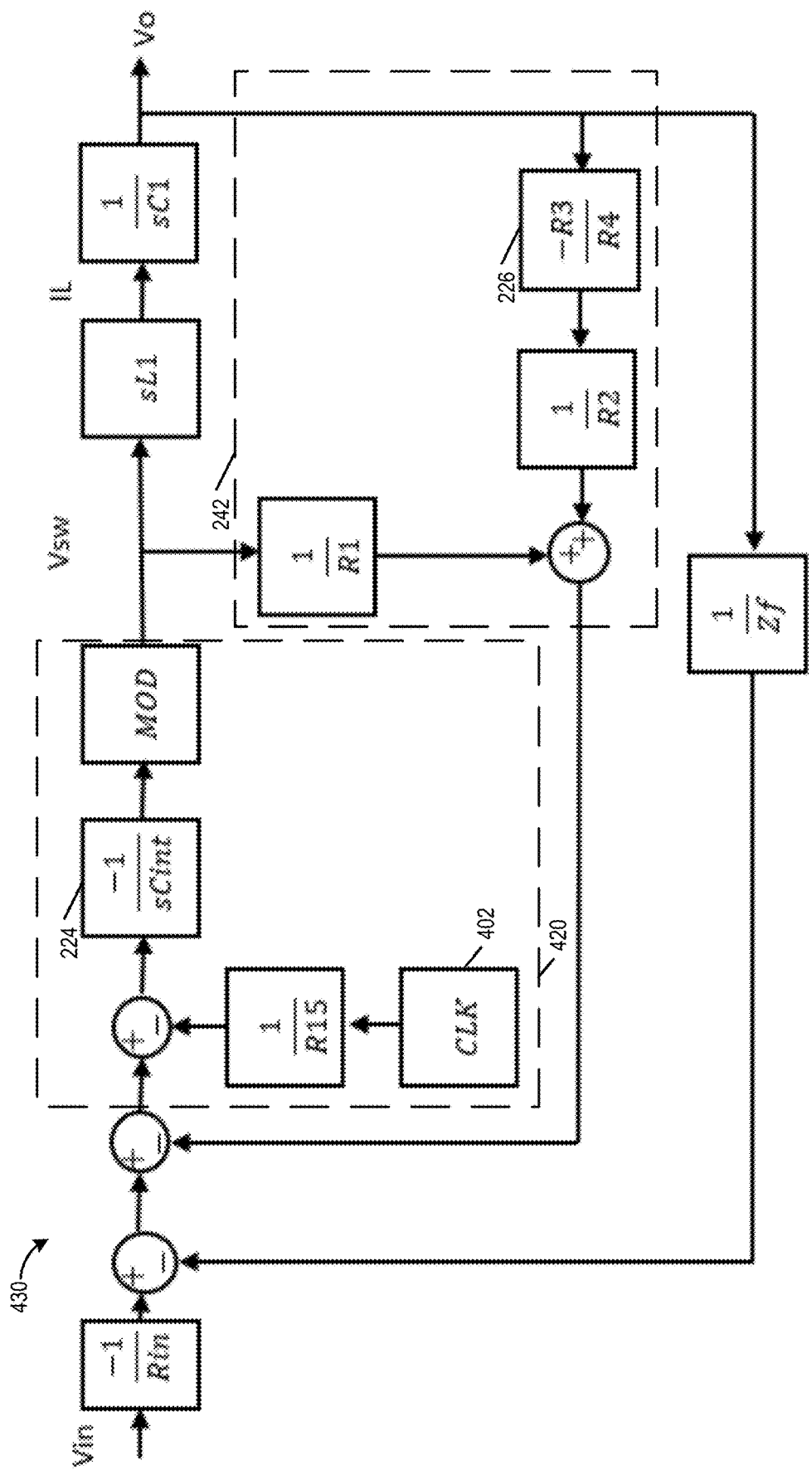
FIG. 4D illustrates a block diagram of a current controlled audio amplifier using a square wave generator in accordance with certain embodiments.
Figure 4E:
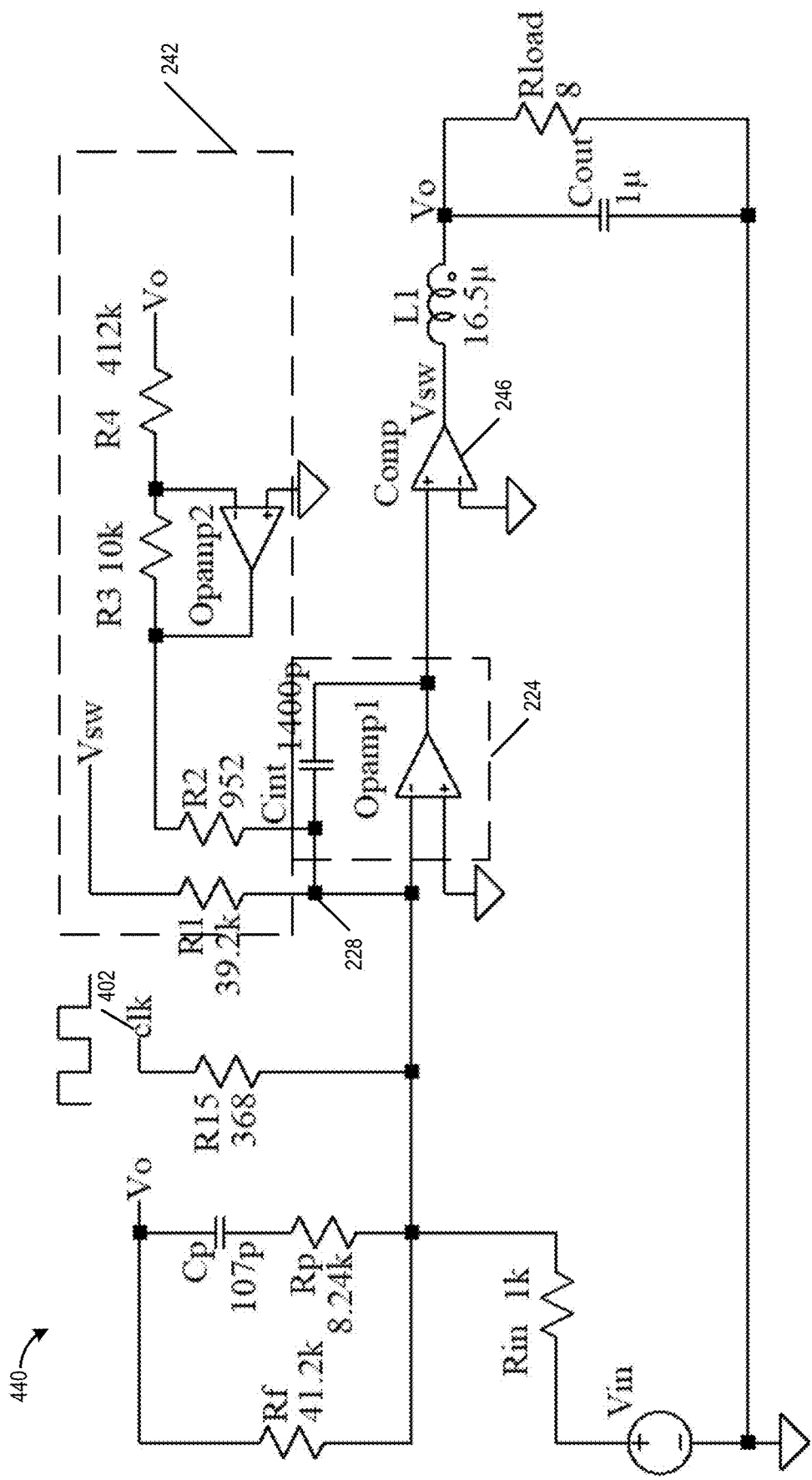
FIG. 4E illustrates an example circuit implementation corresponding to the block diagram of FIG. 4D in accordance with certain embodiments.

Comparing the block diagram 240 of FIG. 2D with the block diagram 430 of FIG. 4D, an audio amplifier 204 configured to use a triangle wave can be converted to using a square wave clock by replacing the integrator 224 and modulator 244 with the circuit 420. The resultant audio amplifier circuit that uses a square wave clock directly in place of the triangle wave may be depicted by the audio amplifier circuit 440 of FIG. 4E. Comparing the circuit 440 of FIG. 4E to the circuit 250 of FIG. 2E, the triangle generator 248 may be omitted and the circuit 250 may operate directly based on the square wave clock 402. As illustrated with FIGS. 4A-4C, the triangle generator may also include the square wave clock 402. However, by directly using the square wave clock 402 in place of the triangle generator 248, the number of integrators may be reduced.

It should be understood that there are advantages to using both the audio amplifier 250 with the triangle generator 248 and the audio amplifier 440 without the triangle generator. In some cases, noise and total harmonic distortion may be reduced using either the audio amplifier 250 or the audio amplifier 440, and the selection of audio amplifier design may depend on the application for the audio amplifier and the frequencies supported.

As previously indicated, using the opamp based circuit enables current control without the use of an explicit current sensor. Further, the number of opamps required can be reduced using the circuit simplifications disclosed herein. However, as disclosed in the next section, it is also possible to design an audio amplifier without using the opamp feedback method (which may also be referred to as an inverter method) disclosed above enabling further reduction in the opamps used by the audio amplifier. The inverter method can maintain zero volts at the inputs to the opamps. The differential integrator method discussed in the next section may further reduce the number of opamps, but may not maintain zero volts at the inputs to the opamps it does include. In some cases, it may be desirable to be able to maintain zero volts at the inputs to the opamps to enable the amplifier circuit to work with other circuits, such as a clip limiter circuit, included in a system. Thus, although the differential integrator version of the amplifier circuit may be desirable in some cases to reduce circuit complexity and size, in other cases the inverter version of the amplifier circuit may be desirable to enable the amplifier to work with other circuits included in a system.

Example Differential Integrator Audio Amplifier

Figure 5A:
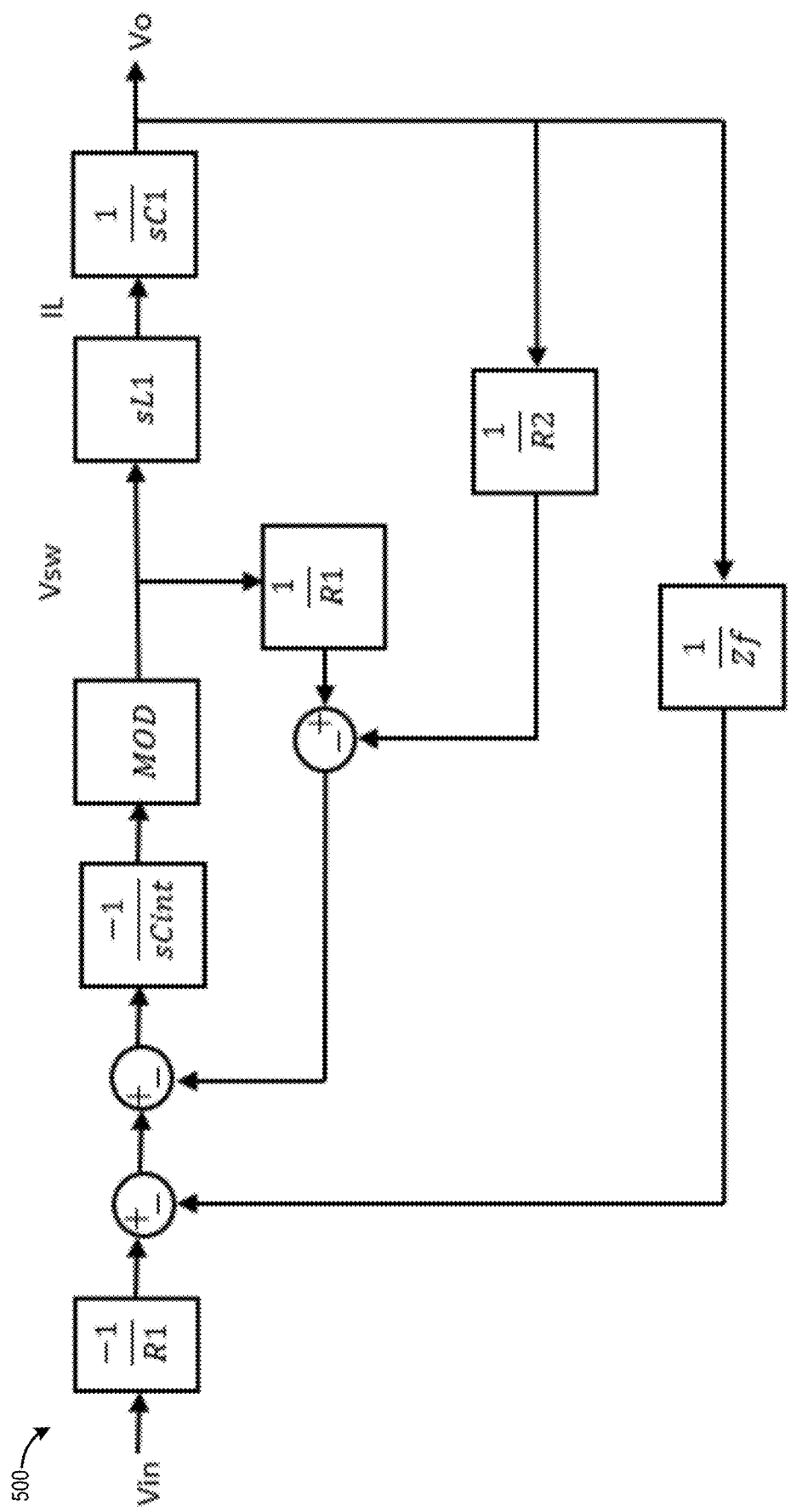
FIG. 5A illustrates a block diagram a block diagram of a current controlled audio amplifier without an explicit current sensor and using a differential integrator in accordance with certain embodiments.
Figure 5B:
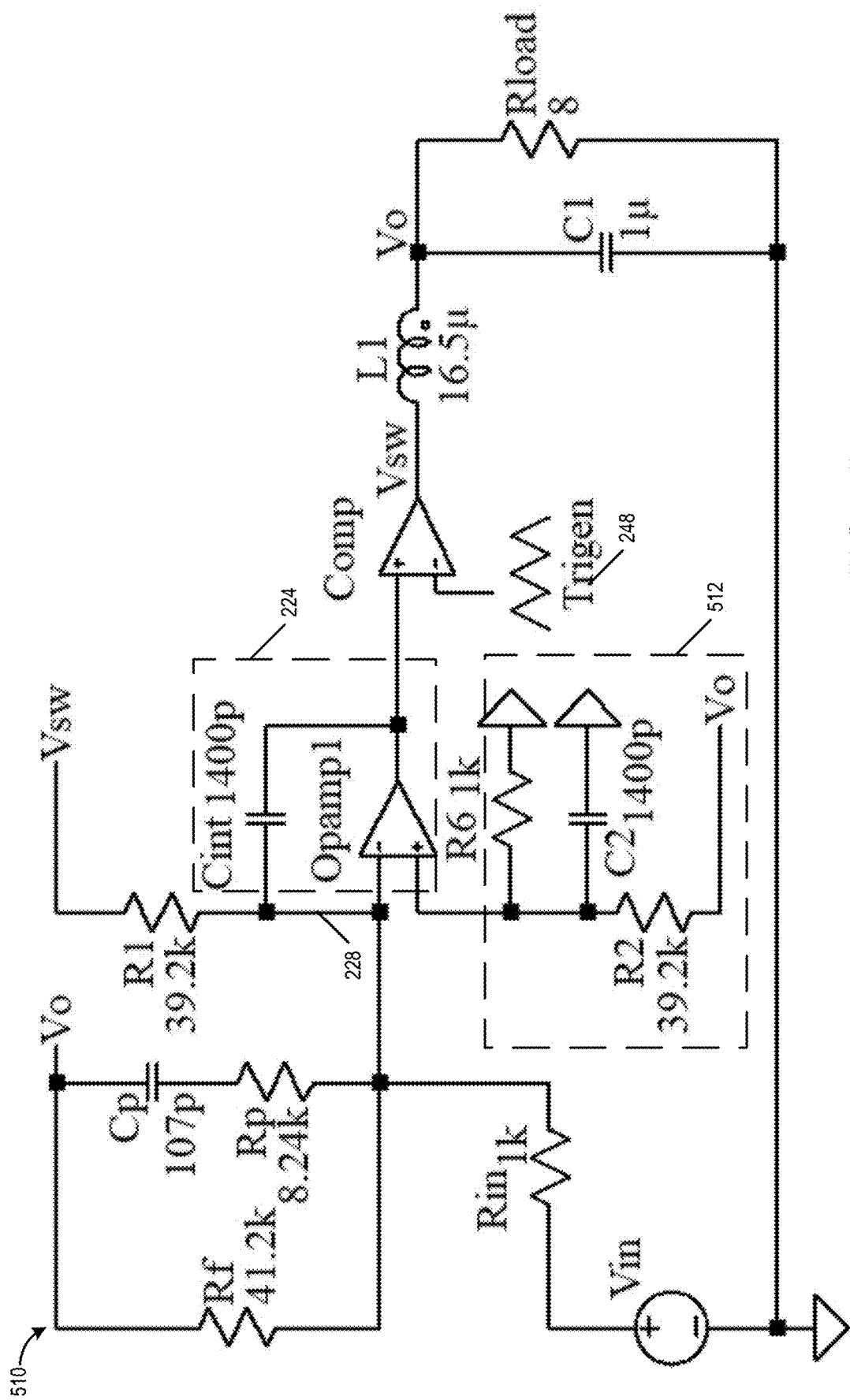
FIG. 5B illustrates an example circuit implementation corresponding to the block diagram of FIG. 5A in accordance with certain embodiments.

As an alternative to the opamp feedback method disclosed with respect to FIGS. 2B-2E and FIGS. 4D and 4E, the feedback can be taken into the positive input of a differential integrator as shown in FIG. 5B. Advantageously, as illustrated by the block diagram 500 of FIG. 5A, by providing the feedback of Vo to the positive input of the integrator 224, the integrator 226 represented by −R3/R4 can be eliminated.

FIG. 5B illustrates the modification to the feedback loop in the circuit 510 using the differential integrator method compared to the circuit 250 using the inverter method includes replacing the ground connection to the Opamp1 with a feedback loop 512 comprising an RC circuit that feeds back the audio amplifier output signal Vo to the positive input of the Opamp1. This RC circuit may be coupled to the positive input of the operational amplifier included as part of the integrator 224. Moreover, the opamp circuit 242, including the integrator 226 may be eliminated. Thus, the number of opamps utilized by the audio amplifier may be further reduced compared to the audio amplifier circuit 230 from four opamps to one opamp.

Figure 5C:
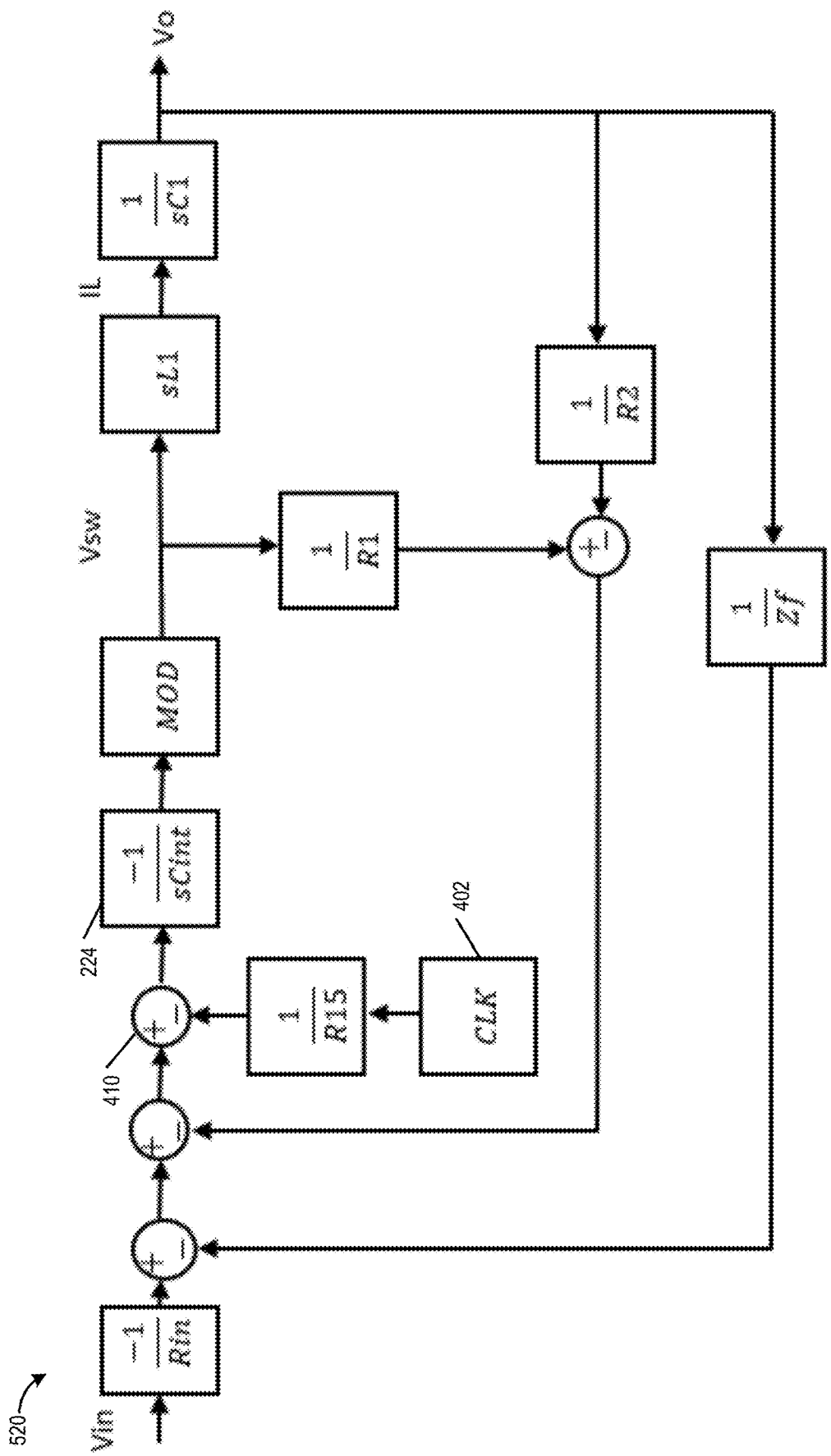
FIG. 5C illustrates a block diagram of the current controlled audio amplifier of FIG. 5A using a square wave generator in accordance with certain embodiments.
Figure 5D:
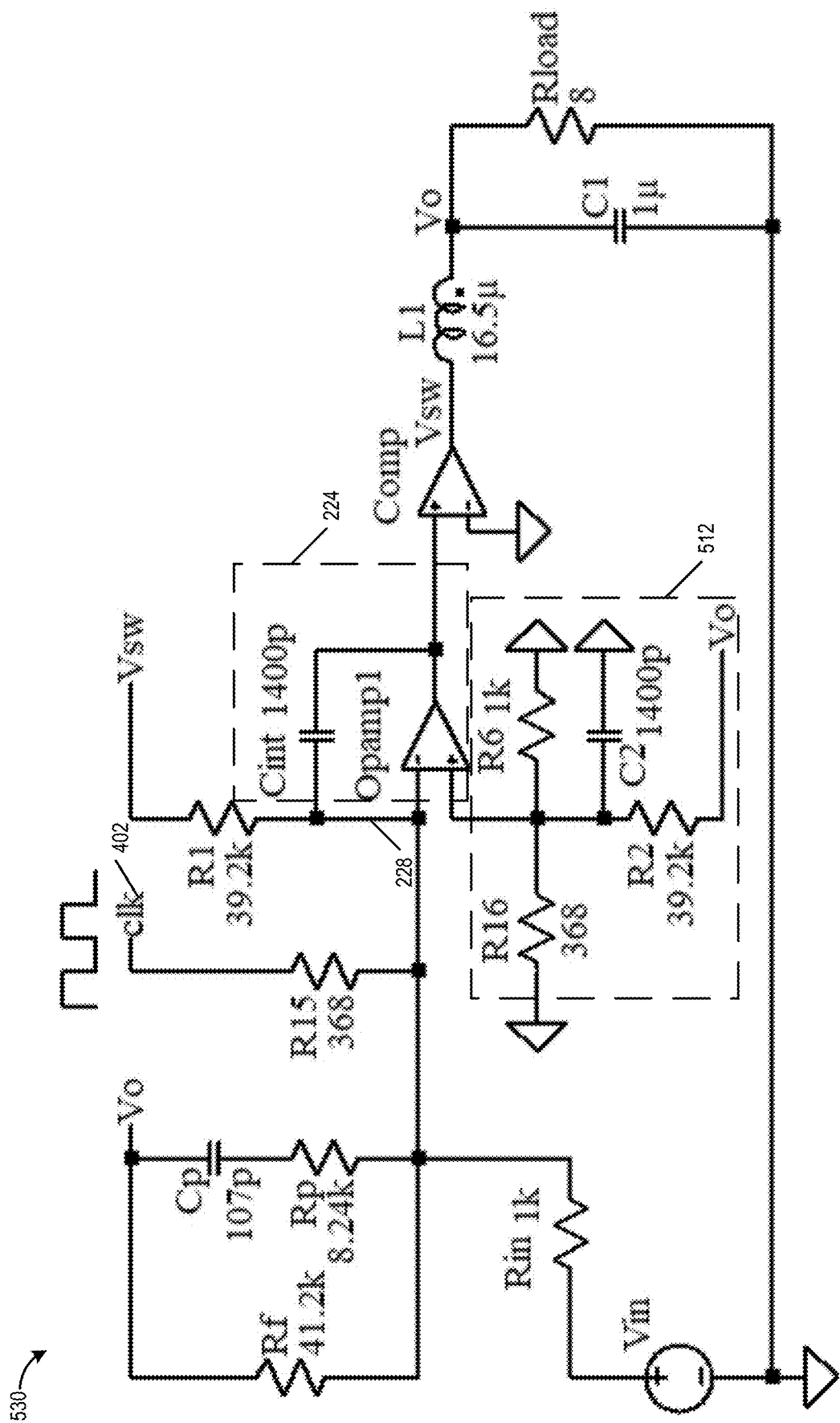
FIG. 5D illustrates an example circuit implementation corresponding to the block diagram of FIG. 5C in accordance with certain embodiments.

Further, just as the audio amplifier circuit 250 can be modified to remove the triangle generator 248 and function using the square wave clock 402 as illustrated in FIG. 4E, so can the audio amplifier 510 be modified to remove the use of the triangle generator 248. Eliminating the triangle generator 248 enables the elimination of an integrator further simplifying the audio amplifier circuit enabling reduced noise and smaller form factors for the audio amplifier. FIGS. 5C and 5D, reflect the conversion of the audio amplifier 510 from using a triangle generator 248 to operating directly using a square wave clock 402. FIG. 5C presents a block diagram 520 illustrating the clock signal of a square wave clock 402 being supplied to the integrator 224 via the adder 410. FIG. 5D presents an audio amplifier circuit 530 that is an example implementation of the block diagram 520 of FIG. 5C. As illustrated by the audio amplifier circuit 530, a square wave clock 402 may be fed to the integrator 224. Further, as explained with respect to FIGS. 4A-4C, the reconfiguration of the circuit to support using the square wave clock 402 in place of the triangle generator 248 can eliminate an additional integrator 404 simplifying the audio amplifier circuit.

Example Amplifier Output Stage

FIG. 6 illustrates a simplified circuit diagram of an output stage 306 of an example class D amplifier in accordance with certain embodiments. The output stage 306 is one non-limiting example of an output stage that can be used with the audio amplifier 204.

The illustrated portion of the class D amplifier in FIG. 6 illustrates an output stage 306 implemented by a pair of transistors and an output LC filter. The output LC filter of the output stage 306 may be formed, for example, by L1 and C3 of FIG. 3, L1 and C1 of FIG. 5D, or any other LC filter stage illustrated at the output of the audio amplifiers circuits described herein. A number of additional elements may form part of the class D amplifier as illustrated in FIG. 3. The output stage 306 may include a pair of switches 602 and 604 implemented by transistors. These transistors 602, 604 may be field-effect transistors (FETs), such as metal-oxide-semiconductor FETs (MOSFETs). The switch 602 may be connected to +Vrail and the switch 604 may be connected to −Vrail. Further, the switches 602 and 604 may alternate between on and off states with one switch being on while the other switch is off. Thus, when the switches are active, the output or switch voltage Vswitch, may alternate between +Vrail and −Vrail.

It should be understood that FIG. 6 illustrates one non-limiting example of the output stage of a class D amplifier. Other implementations are possible.

Further, as previously described, the amplifier may include a filter, such as an LC filter that includes an inductor 606 (or inductor L1 of FIG. 3) and a capacitor 608 (or capacitor C3 of FIG. 3). When the output stage 306 is active, a current may flow through the inductor 606 charging the inductor 606 and, in some cases, the capacitor 608. An output signal may appear at the node Vout, which can be provided to a subsequent system, such as a speaker system.

Experimental Results

Figure 7:
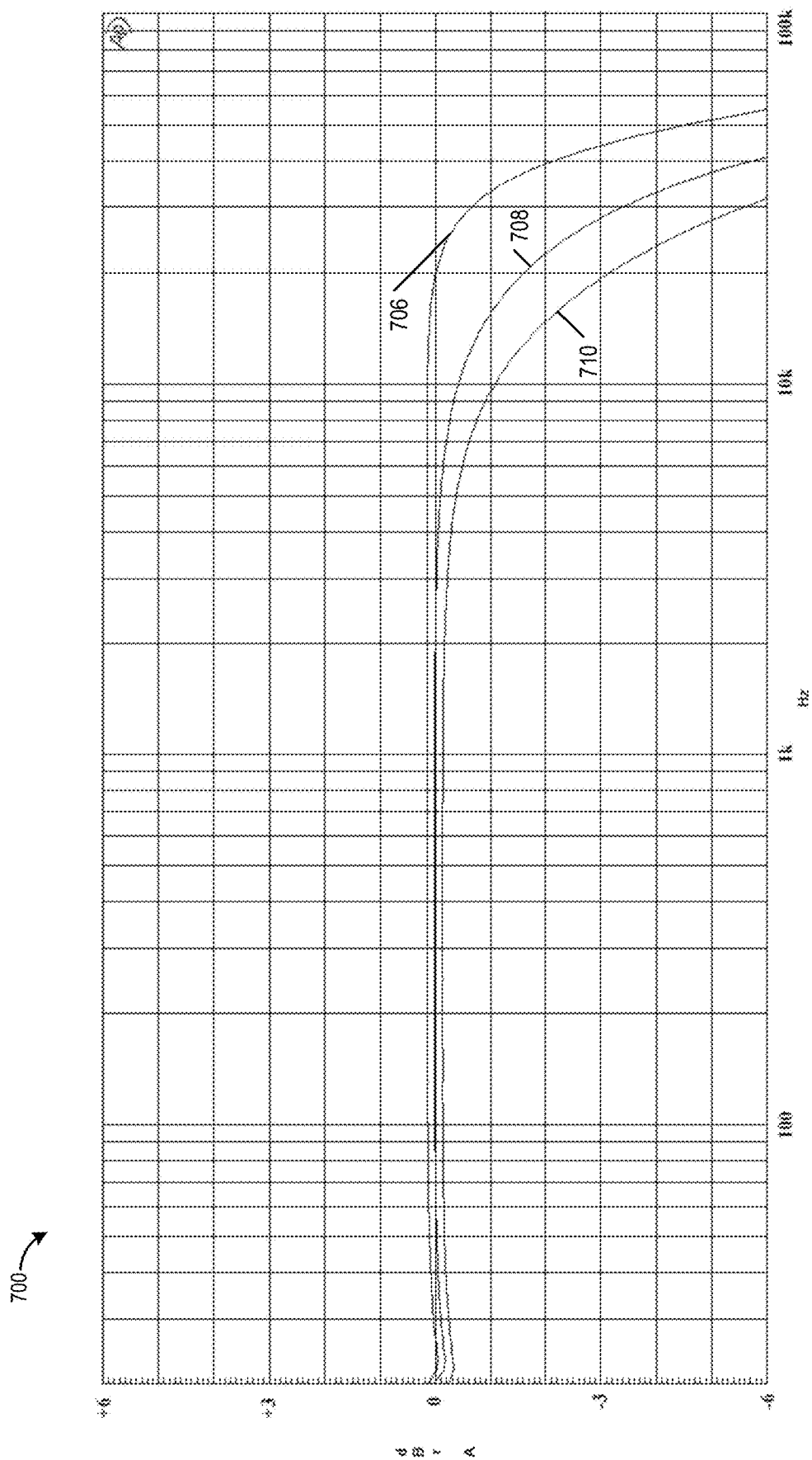
FIG. 7 illustrates the frequency response of a class D amplifier implemented using current mode control.

FIG. 7 illustrates the frequency response of the example audio amplifier circuits implemented using the current mode control described herein. The graph 700 illustrated in FIG. 7 illustrates experimental results for a frequency response of three load conditions of implementations of the inverter triangle wave audio amplifier circuit 250 of FIG. 2E, the inverter square wave audio amplifier circuit 440 of FIG. 4E, the differential integrator triangle wave audio amplifier circuit 510 of FIG. 5B, and the differential integrator square wave audio amplifier circuit 530 of FIG. 5D. As all four circuit implementations performed similarly with respect to noise levels, total harmonic distortion (THD), and frequency response, each of the three lines in the graph 700 cumulatively represent the four circuits 250, 440, 510, and 530 under different load conditions.

The graph 700 illustrates three lines associated with different load conditions caused by the load on the audio amplifier circuits by a speaker 206 connected to the audio amplifier circuits 250, 440, 510, or 530. The line 706 (corresponding to the line 106 of FIG. 1A) represents the frequency response of the audio amplifier without a load (e.g., when the audio amplifier is not connected to a speaker). The line 708 (corresponding to the line 108 of FIG. 1A) represents the frequency response of the amplifier when connected to a speaker with an 8Ω impedance. The line 710 represents the frequency response of the amplifier when connected to a 4Ω impedance. As can be seen in FIG. 7, when using the current mode control of the present disclosure, the droops that were previously depicted in the region 102 of FIG. 1A, and the peaks that were previously depicted in the region 104 of FIG. 1A are eliminated. Instead, as illustrated in FIG. 7, the frequency response of the audio amplifier rolls off at about 10 kHz depending on the load condition.

A number of different current mode control implementations of an audio amplifier without an explicit current sensor have been described herein. Further, as has been shown by the experimental results, each of the implementations may have similar noise, THD, and frequency response. Accordingly, each of the implementations described herein may be desirable under various conditions. Moreover, embodiments disclosed herein with respect to one audio amplifier design may be applicable to one or more other audio amplifier designs described herein. Advantageously, the audio amplifiers disclosed herein are simplified compared to existing audio amplifiers reducing both the number of opamps and the number of integrators used by the audio amplifier. This reduction in opamps and integrators not only simplifies circuit design, but it enables the audio amplifier to fit within a smaller form factor compared to existing audio amplifier designs.

Terminology

It is to be understood that not necessarily all objects or advantages may be achieved in accordance with any particular aspect or embodiment described herein. Thus, for example, those skilled in the art will recognize that certain aspects or embodiments may be configured to operate in a manner that achieves or optimizes one advantage or group of advantages as taught herein without necessarily achieving other objects or advantages as may be taught or suggested herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of aspects or embodiments of the inventions are not intended to be exhaustive or to limit the inventions to the precise form disclosed above. While specific aspects and embodiments of, and examples for, the inventions are described above for illustrative purposes, various equivalent modifications are possible within the scope of the inventions, as those skilled in the relevant art will recognize. For example, while processes or blocks are presented in a given order, alternative aspects or embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various aspects and embodiments described above can be combined to provide further aspects and embodiments.

Conditional language used herein, such as, among others, "can," "might," "may," "e.g.," and the like, unless specifically stated otherwise, or otherwise understood within the context as used, is generally intended to convey that certain aspects or embodiments include, while other aspects or embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain aspects or embodiments of the inventions have been described, these aspects or embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An audio amplifier comprising:
a power output stage configured to output an audio output signal, the audio output signal generated by amplifying an audio input signal;
an output filter connected to the power output stage and configured to filter the audio output signal to generate a filtered output signal, wherein the output filter comprises an inductor;
a first feedback loop between a first node and a summing node, the first node between the power output stage and the inductor, wherein the first feedback loop is configured to provide a first current to an integrator at the summing node, and wherein the first feedback loop comprises a first resistor configured to provide the first current to the integrator; and
a second feedback loop between a second node and the summing node, the second node between the inductor and an output of the audio amplifier, wherein the second feedback loop is configured to provide a second current to the integrator at the summing node, wherein the second feedback loop comprises a first operational amplifier and a second resistor connected between the second node and a third resistor, wherein the third resistor is connected between the second resistor and a fourth resistor, and is connected between an inverting input of the first operational amplifier and an output of the first operational amplifier, and wherein an integrator output of the integrator provides current mode control of the audio amplifier.

2. The audio amplifier of claim 1, wherein the power output stage comprises a first field-effect transistor connected between the output filter and a first rail voltage, and a second field effect transistor connected between the output filter and a second rail voltage.

3. The audio amplifier of claim 1, wherein a resistance of the fourth resistor is equal to a resistance of the first resistor multiplied by a ratio of a resistance of the third resistor to a resistance of the second resistor.

4. The audio amplifier of claim 1, wherein the first operational amplifier is configured as an inverter.

5. The audio amplifier of claim 1, wherein the second feedback loop comprises a second integrator configured to provide the second current to the summing node.

6. The audio amplifier of claim 1, wherein the integrator comprises a differential integrator, and wherein the second feedback loop comprises an RC circuit coupled to a positive input of an operational amplifier of the differential integrator.

7. The audio amplifier of claim 1, wherein a combination of the first current and the second current generates a current that is proportional to a winding voltage of the inductor.

8. The audio amplifier of claim 1, further comprising the integrator, wherein the integrator comprises a capacitor and a second operational amplifier, and wherein the capacitor is connected between an inverting input of the second operational amplifier and an output of the second operational amplifier.

9. The audio amplifier of claim 1, wherein the audio amplifier is a type 2 controller.

10. The audio amplifier of claim 1, wherein the integrator output of the integrator provides current mode control of the audio amplifier without inclusion of a current sensor.

11. The audio amplifier of claim 1, further comprising a square wave clock input to the summing node, and a comparator configured to receive the integrator output at a positive input of the comparator, and wherein a negative input of the comparator is connected to ground thereby enabling elimination of a triangle generator of the audio amplifier.

12. An audio system comprising:
a speaker configured to output audio; and
an audio amplifier in communication with the speaker and configured to provide an audio output signal to the speaker for output, wherein the audio amplifier comprises:
a power output stage configured to output the audio output signal to the speaker to produce audio output, the audio output signal generated by amplifying an audio input signal;

an output filter connected to the power output stage and configured to filter the audio output signal to generate a filtered output signal, wherein the output filter comprises an inductor;

a first feedback loop between a first node and a summing node, the first node between the power output stage and the inductor, wherein the first feedback loop is configured to provide a first current to an integrator at the summing node, and wherein the first feedback loop comprises a first resistor configured to provide the first current to the integrator; and a second feedback loop between a second node and the summing node, the second node between the inductor and an output of the audio amplifier, wherein the second feedback loop is configured to provide a second current to the integrator at the summing node, wherein the second feedback loop comprises a second resistor connected between the second node and a third resistor that is connected between the second resistor and a fourth resistor, and wherein an integrator output of the integrator provides current mode control of the audio amplifier.

13. The audio system of claim 12, wherein a resistance of the fourth resistor is selected to equal a resistance of the first resistor multiplied by a ratio of a resistance of the third resistor to a resistance of the second resistor.

14. The audio system of claim 12, wherein the second feedback loop further comprises a first operational amplifier, wherein the third resistor is connected between an inverting input of the first operational amplifier and an output of the first operational amplifier, and wherein the first operational amplifier is configured as an inverter.

15. The audio system of claim 12, further comprising the integrator, wherein the integrator comprises a capacitor and a second operational amplifier, and wherein the capacitor is connected between an inverting input of the second operational amplifier and an output of the second operational amplifier.

16. The audio system of claim 12, wherein a combination of the first current and the second current generates a current that is proportional to a winding voltage of the inductor.

17. An audio amplifier comprising:
a power output stage configured to output an audio output signal, the audio output signal generated by amplifying an audio input signal;

an output filter connected to the power output stage and configured to filter the audio output signal to generate a filtered output signal, wherein the output filter comprises an inductor;

a first feedback loop between a first node and a summing node, the first node between the power output stage and the inductor, wherein the first feedback loop is configured to provide a first current to an integrator at the summing node;

a second feedback loop between a second node and the summing node, the second node between the inductor and an output of the audio amplifier, wherein the second feedback loop is configured to provide a second current to the integrator at the summing node, and wherein an integrator output of the integrator provides current mode control of the audio amplifier; and a square wave clock input to the summing node, and a comparator configured to receive the integrator output at a positive input of the comparator, and wherein a negative input of the comparator is connected to ground thereby enabling elimination of a triangle generator of the audio amplifier.

18. The audio amplifier of claim 17, wherein the first feedback loop comprises a first resistor configured to provide the first current to the integrator.

19. The audio amplifier of claim 18, wherein the second feedback loop comprises a second resistor connected between the second node and a third resistor that is connected between the second resistor and a fourth resistor.

20. The audio amplifier of claim 19, wherein the second feedback loop further comprises a first operational amplifier, and wherein the third resistor is connected between an inverting input of the first operational amplifier and an output of the first operational amplifier.

21. The audio amplifier of claim 18, wherein the second feedback loop comprises a second integrator configured to provide the second current to the summing node.

* * * * *